US009075090B2

(12) United States Patent
Zimmerman et al.

(10) Patent No.: US 9,075,090 B2
(45) Date of Patent: Jul. 7, 2015

(54) BATTERY MONITORING CIRCUIT

(75) Inventors: Mark D. Zimmerman, Twinsburg, OH (US); Baiying Yu, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 617 days.

(21) Appl. No.: 13/357,824

(22) Filed: Jan. 25, 2012

(65) Prior Publication Data
US 2013/0041607 A1   Feb. 14, 2013

Related U.S. Application Data

(60) Provisional application No. 61/522,577, filed on Aug. 11, 2011.

(51) Int. Cl.
  *G01R 31/36*  (2006.01)
  *G01R 19/165*  (2006.01)
(52) U.S. Cl.
  CPC ........ G01R 19/16542 (2013.01); *G01R 31/362* (2013.01); *G01R 31/3662* (2013.01)
(58) Field of Classification Search
  CPC .................................................. G01R 31/3662
  USPC .......................................................... 702/63
  See application file for complete search history.

(56) References Cited

U.S. PATENT DOCUMENTS

| 4,193,026 | A | 3/1980 | Finger et al. |
| 4,679,000 | A * | 7/1987 | Clark ............................ 324/428 |
| 5,818,333 | A | 10/1998 | Yaffe et al. |
| 5,965,997 | A | 10/1999 | Alwardi et al. |
| 6,810,338 | B2 | 10/2004 | Mercke et al. |
| 7,190,171 | B2 * | 3/2007 | Kawakami et al. ........... 324/430 |
| 7,215,999 | B1 | 5/2007 | Shahandeh et al. |
| 7,939,190 | B2 | 5/2011 | Colello et al. |
| 7,984,651 | B2 | 7/2011 | Randall et al. |
| 2003/0169020 | A1 * | 9/2003 | Malcolm ....................... 320/136 |
| 2006/0267555 | A1 | 11/2006 | Cargonja et al. |
| 2008/0186028 | A1 | 8/2008 | Jones et al. |
| 2012/0139611 | A1 * | 6/2012 | Schwoerer .................... 327/339 |

OTHER PUBLICATIONS

Chen, et al., "Accurate electrical battery model capable of predicting runtime and I-V performance," IEEE Transactions on Energy Conversion, vol. 21, No. 2, Jun. 2006, pp. 504-511.
Cheng, et al., "Battery-Management System (BMS) and SOC Development for Electrical Vehicles," IEEE Transactions on Vehicular Technology, Jan. 2011, vol. 60, No. 1 pp. 76-88.
International Search Report and Written Opinion—PCT/US2012/050468—ISA/EPO—Nov. 19, 2012.

* cited by examiner

*Primary Examiner* — Andrew Schechter
*Assistant Examiner* — Regis Betsch

(57) ABSTRACT

A battery monitoring circuit is described. The battery monitoring circuit includes a high counter that increments when a sense voltage measurement is above a threshold. The battery monitoring circuit also includes a low counter that increments when the sense voltage measurement is below the threshold. The battery monitoring circuit further includes state machine circuitry coupled to the high counter and to the low counter. The battery monitoring circuit additionally includes open circuit voltage monitoring circuitry coupled to the state machine circuitry. The battery monitoring circuit also includes resistance monitoring circuitry coupled to the state machine circuitry.

38 Claims, 11 Drawing Sheets

BATTERY MONITORING CIRCUIT

CLAIM OF PRIORITY UNDER 35 U.S.C. §119

The present application for patent claims priority to Provisional Application No. 61/522,577, entitled "A BATTERY MONITORING CIRCUIT" filed Aug. 11, 2011, and assigned to the assignee hereof and hereby expressly incorporated by reference herein.

TECHNICAL FIELD

The present disclosure relates generally to electronic devices. More specifically, the present disclosure relates to a battery monitoring circuit.

BACKGROUND

In the last several decades, the use of electronic devices has become common. In particular, advances in electronic technology have reduced the cost of increasingly complex and useful electronic devices. Cost reduction and consumer demand have proliferated the use of electronic devices such that they are practically ubiquitous in modern society. As the use of electronic devices has expanded, so has the demand for new and improved features of electronic devices. More specifically, electronic devices that perform functions faster, more efficiently or with higher quality are often sought after.

Electronic devices may use one or more energy sources in order to function. Some electronic devices use portable energy sources, such as batteries. Typically, a battery needs to be periodically recharged. For example, a cellular phone may use a battery to function. The cellular phone may consume electrical charge over time, thereby discharging the battery. The usable electrical charge stored in the battery will eventually be exhausted unless the battery is recharged. The cellular phone may be coupled to another energy source, such as an electrical wall outlet, for recharging.

Estimating the remaining electrical charge in a battery is one current challenge. Some approaches to estimating the remaining electrical charge have made the use of complex microprocessor-controlled state machines. These approaches may require a relatively large amount of chip area to implement. As can be observed from this discussion, systems and methods that improve battery monitoring may be beneficial.

SUMMARY

A battery monitoring circuit is disclosed. The battery monitoring circuit includes a high counter that increments when a sense voltage measurement is above a threshold. The battery monitoring circuit also includes a low counter that increments when the sense voltage measurement is below the threshold. The battery monitoring circuit further includes state machine circuitry coupled to the high counter and to the low counter. The battery monitoring circuit additionally includes open circuit voltage monitoring circuitry coupled to the state machine circuitry. The battery monitoring circuit also includes resistance monitoring circuitry coupled to the state machine circuitry.

The battery monitoring circuit may also include a coulomb counter. The battery monitoring circuit may also include output registers for storing measurements coupled to the open circuit voltage monitoring circuitry, coupled to the coulomb counter and coupled to the resistance monitoring circuitry. The battery monitoring circuit may provide an open circuit voltage measurement, a consumed charge measurement, a resistance monitoring open circuit voltage measurement, a resistance monitoring battery voltage measurement and a resistance monitoring sense voltage measurement to a processor.

The state machine circuitry may operate according to a high-load state, a low-load state, a resistance measurement state and an open circuit voltage measurement state. The battery monitoring circuit may operate autonomously from a software processor. The battery monitoring circuit may use a repurposed analog-to-digital converter. The battery monitoring circuit may be integrated into a power management circuit.

If the state machine circuitry indicates a low-load state, the battery monitoring circuit may measure the sense voltage at a lower frequency. The battery monitoring circuit may also determine whether a first low counter limit has been reached by the low counter or a first high counter limit has been reached by the high counter if the low-load state is indicated. If the low-load state is indicated, the battery monitoring circuit may also transition, by the state machine circuitry, to a high-load state if the first high counter limit has been reached. If the low-load state is indicated, the battery monitoring circuit may transition, by the state machine circuitry, to an open circuit voltage measurement state if the first low counter limit has been reached.

If the state machine indicates a high-load state, the battery monitoring circuit may measure the sense voltage at a higher frequency. The battery monitoring circuit may also determine whether a second low counter limit has been reached by the low counter or a second meta counter limit has been reached by a meta counter if the high-load state is indicated. The battery monitoring circuit may additionally transition, by the state machine circuitry, to a low-load state if the second low counter limit has been reached and if the high-load state is indicated. If the high-load state is indicated, the battery monitoring circuit may further transition, by the state machine circuitry, to a resistance measurement state if the second meta counter limit has been reached.

If the state machine circuitry indicates an open circuit voltage measurement state, the battery monitoring circuit may obtain a battery voltage measurement and a sense voltage measurement. If the open circuit voltage measurement state is indicated, the battery monitoring circuit may also determine whether a third low counter limit has been reached by the low counter or a third meta counter limit has been reached by a meta counter. If the open circuit voltage measurement state is indicated, the battery monitoring circuit may further transition, by the state machine circuitry, to a low-load state if the third meta counter limit has been reached. If the open circuit voltage measurement state is indicated, the battery monitoring circuit may also determine, by the open circuit voltage monitoring circuitry, whether a voltage is settled if the third low counter limit has been reached. If the open circuit voltage measurement state is indicated, the battery monitoring circuitry may additionally update, by the open circuit voltage monitoring circuitry, an open circuit voltage measurement if the voltage is settled. If the open circuit voltage measurement state is indicated, the battery monitoring circuit may also reset, by a controller, a coulomb counter if the voltage is settled. If the open circuit voltage measurement state is indicated, the battery monitoring circuit may additionally update, by the resistance monitoring circuitry, a resistance monitoring open circuit voltage measurement if the voltage is settled and if a previous resistance monitoring battery voltage measurement and a previous resistance monitoring sense voltage measurement have been taken.

If the state machine circuitry indicates an open circuit voltage measurement state, the battery monitoring circuit is may further determine whether a third high counter limit has been reached by the high counter. If the third high counter limit has been reached, then the battery monitoring circuit may transition, by the state machine circuitry, to the open circuit voltage measurement state.

If the state machine circuitry indicates a resistance measurement state, the battery monitoring circuit may obtain a battery voltage measurement and a sense voltage measurement. If the resistance measurement state is indicated, the battery monitoring circuit may also determine whether a fourth low counter limit has been reached by the low counter or a fourth high counter limit has been reached by the high counter. If the resistance measurement state is indicated, the battery monitoring circuit may further transition, by the state machine circuitry, to a high-load state if the fourth low counter limit has been reached. If the resistance measurement state is indicated, the battery monitoring circuit may additionally transition, by the state machine circuitry, to the resistance measurement state if the fourth high counter limit has been reached.

If the state machine circuitry indicates a resistance measurement state, the battery monitoring circuit may further determine whether a fourth meta counter limit has been reached by a meta counter. If the fourth meta counter limit has been reached, the battery monitoring circuit may update, by the resistance monitoring circuitry, a resistance monitoring battery voltage. If the fourth meta counter limit has been reached, the battery monitoring circuit may also update, by the resistance monitoring circuitry, a resistance monitoring sense voltage. If the fourth meta counter limit has been reached, the battery monitoring circuit may additionally stand by, by the resistance monitoring circuitry, to update a resistance monitoring open circuit voltage.

A method for monitoring a battery is also disclosed. The method includes incrementing a high counter when a sense voltage measurement is above a threshold. The method also includes incrementing a low counter when the sense voltage measurement is below the threshold. The method further includes controlling a state based on a high counter limit and a low counter limit. The method additionally includes controlling open circuit voltage monitoring circuitry based on the state. The method also includes controlling resistance monitoring circuitry based on the state.

A computer-program product for monitoring a battery is also disclosed. The computer-program product includes a non-transitory tangible computer-readable medium with instructions. The instructions include code for causing a high counter to increment when a sense voltage measurement is above a threshold. The instructions also include code for causing a low counter to increment when the sense voltage measurement is below the threshold. The instructions further include code for causing a battery monitoring circuit to control a state based on a high counter limit and a low counter limit. The instructions additionally include code for causing the battery monitoring circuit to control open circuit voltage monitoring circuitry based on the state. The instructions also include code for causing the battery monitoring circuit to control resistance monitoring circuitry based on the state.

An apparatus for monitoring a battery is also disclosed. The apparatus includes means for incrementing a high counter when a sense voltage measurement is above a threshold. The apparatus also includes means for incrementing a low counter when the sense voltage measurement is below the threshold. The apparatus further includes means for controlling a state based on a high counter limit and a low counter limit. The apparatus additionally includes means for controlling open circuit voltage monitoring circuitry based on the state. The apparatus also includes means for controlling resistance monitoring circuitry based on the state.

DETAILED DESCRIPTION

Figure 1:
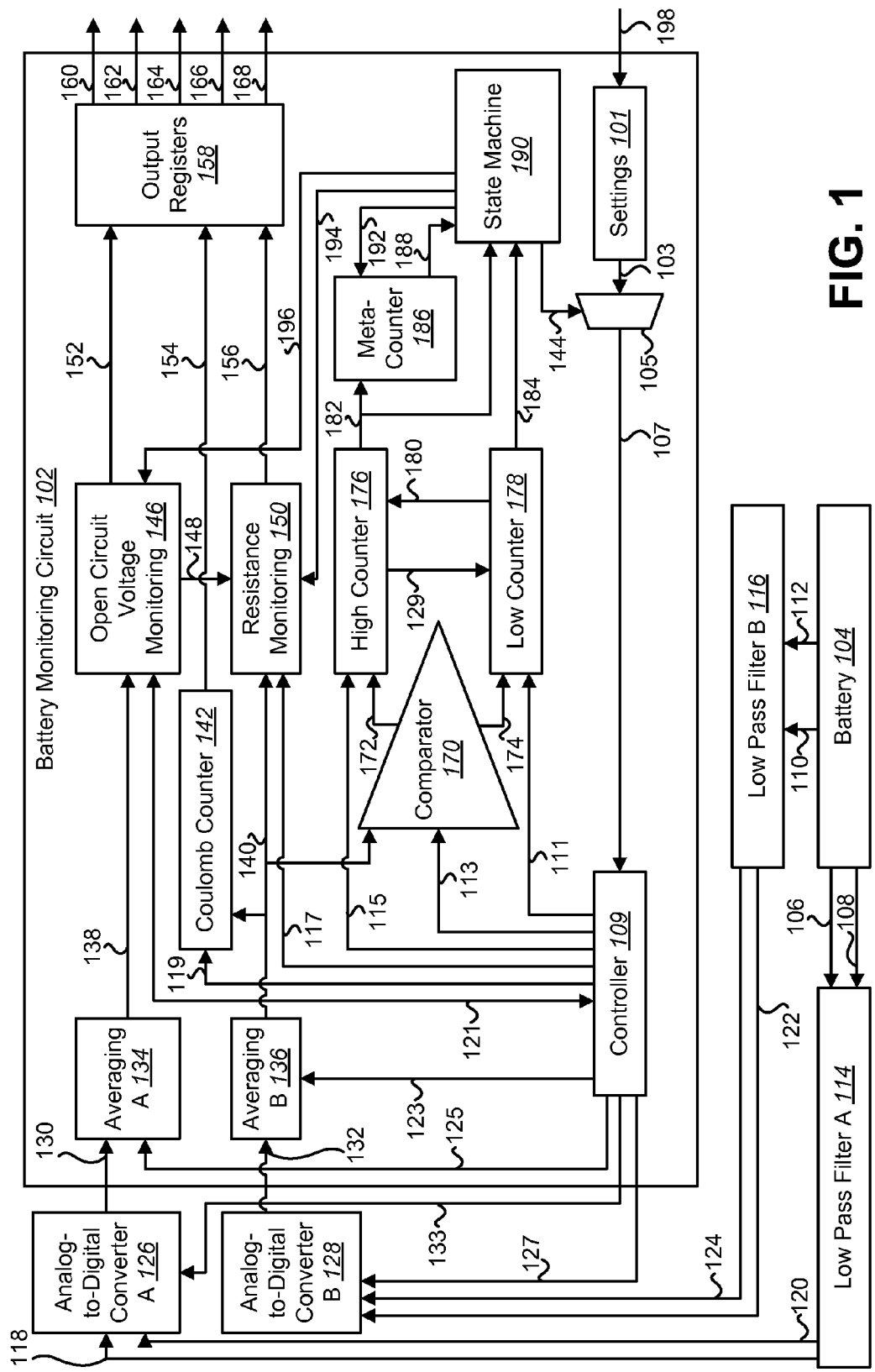
FIG. 1 is a block diagram illustrating one configuration of a battery monitoring circuit.

The systems and methods disclosed herein may be applied to a variety of electronic devices. Examples of electronic devices include integrated circuits, cellular phones, voice recorders, video cameras, audio players (e.g., Moving Picture Experts Group-1 (MPEG-1) or MPEG-2 Audio Layer 3 (MP3) players), video players, audio recorders, laptop computers, netbook computers, tablet devices, personal digital assistants (PDAs), gaming systems, etc. One kind of electronic device is a communication device, which may communicate with another device. Examples of communication devices include telephones, laptop computers, desktop computers, cellular phones, smartphones, wireless or wired modems, e-readers, tablet devices, and gaming systems.

As used herein, the terms "circuit," "circuitry" and other variations of the term "circuit" may denote a structural element or component. For example, circuitry can be an aggregate of circuit components, such as a multiplicity of integrated circuit components, in the form of processing and/or memory cells, units, blocks and/or other components. As used herein, the term "block/module" may indicate that an element or component may be implemented in hardware, software or a combination of both. For example, a "block/module" may be implemented in circuitry, in software that is run on a processor or in a combination of both.

It should be noted that the terms "couple," "coupling," "coupled" or other variations of the word couple as used herein may indicate either an indirect connection or a direct connection. For example, if a first component is "coupled" to a second component, the first component may be either indirectly connected (e.g., through another component) to the second component or directly connected to the second component. Additionally, it should be noted that as used herein, designating a component, element or entity (e.g., transistor, capacitor, resistor, power supply, circuit, block/module, etc.) as a "first," "second," "third" or "fourth" component may be arbitrary and is used to distinguish components for explanatory clarity. It should also be noted that labels used to designate a "second," "third" or "fourth," etc. do not necessarily imply that elements using preceding labels "first," "second" or "third," etc. are included or used. For example, simply because an element or component is labeled a "third" component does not necessarily imply that "first" and "second" elements or components exist or are used. In other words, the numerical labels (e.g., first, second, third, fourth, etc.) are labels used for ease in explanation and do not necessarily imply a particular number of elements, a particular order or a particular structure. Thus, the components may be labeled or numbered in any manner.

It should be noted that the term "simultaneous" and variations thereof may denote that two events may overlap in time and/or may occur near in time to each other. However, the term "simultaneous" and variations thereof may or may not denote that two events occur at exactly the same time.

Some acronyms and/or abbreviations may be used herein for convenience. A battery monitoring system (BMS) may be a system that reports the state of charge of a battery. Full charge capacity (FCC) may be a total amount of charge that can be extracted from a fully charged battery. In one configuration, full charge capacity (FCC) may be defined as an amount that can be extracted from the battery at a discharge current less than 1/20 coulomb (C). FCC may change with age and cycle life of the battery. Remaining capacity (RC) may be an amount of charge remaining in the battery at its current state. After a full charge, RC=FCC. Like FCC, it may be assumed that the discharge current is less than 1/20 C. Unusable capacity (UUC) may be the battery capacity that cannot be used due to the voltage drop across the battery impedance reducing the battery voltage below a failure voltage. UUC may be a function of discharging current.

Usable capacity (UC) may be a charge held by a battery after a full charging cycle minus the charge that cannot be used at a given load due to battery impedance. For example, UC=FCC−UUC. Remaining usable capacity (RUC) may be the remaining capacity (RC) minus the unusable capacity (UUC). For example, RUC=RC−UUC. State of charge (SoC) may be a ratio of the remaining capacity to the total capacity (e.g., SoC=RC/FCC). However, when reported to an end user, it may be helpful to factor in UUC (e.g., SoC=RUC/UC= (RC−UUC)/(FCC−UUC)). A C-rate may be a measurement of a discharge rate at which the battery would be depleted in 1 hour. For example, a battery rated at 1 ampere-hour (Ah) provides 1 ampere (A) for one hour if discharged at 1 C. The same battery discharged at 0.5 C would provide 500 milliamperes (mA) for two hours. Open circuit voltage (OCV) may be a battery voltage at steady-state near-zero (e.g., less than C/20) current. It should be noted that a battery voltage may take some time (e.g., five to thirty minutes) to settle to OCV after a load.

The systems and methods disclosed herein describe a control algorithm for a battery monitoring coulomb counter that automatically balances power consumption with accuracy. The control algorithm also autonomously processes battery resistance measurements and coulomb counter resets. For example, the systems and methods disclosed herein may be used to implement an intelligent coulomb counter. In one configuration, the control algorithm may be implemented in simple digital hardware without a microprocessor or software controller. In another configuration, the control algorithm may be implemented in software.

Typically, a battery monitoring system or battery management system (BMS) requires either a very high accuracy analog frontend or sophisticated software control running on a microprocessor to predict the state of charge (SoC) of a battery with high accuracy. For example, achieving competitive SoC accuracy with a traditional coulomb counter may require a very high resolution (e.g., 15-bit, with the least significant bit (LSB) representing approximately 3 microvolts ($\mu$V)) and a low offset current-sensing analog-to-digital converter (ADC) to digitize the battery load current and circumvent the inaccuracy caused by the continuous integration of conversion errors. On the other hand, a 'hybrid' battery monitoring system that includes both coulomb counting and voltage measurements can achieve similar state of charge accuracy with a lower resolution (e.g., 10-12 bit) analog-to-digital converter and provide other advantageous measurements. However, a hybrid system may require a programmable, many-state finite state machine and a significant control system to robustly address the variety of batteries and usage cases available.

Implementing such a hybrid design in hardware may severely limit flexibility, robustness, testability, and limit the potential battery chemistries and discharge profiles that could be addressed by a battery monitoring system. Implementing a 'hybrid' battery monitoring system in software may provide the necessary programmability, but may require either an on-chip microprocessor (which may be unavailable in a power management circuit or power management integrated circuit (PMIC)) or hardware/software coordination between multiple chips. This may limit the chipsets in which the device can be implemented and may require a significant engineering undertaking. It should be noted that in some configurations, a hybrid approach or design may be used in conjunction with the systems and methods disclosed herein.

An intelligent coulomb counter algorithm may allow a battery monitoring system to use a lower resolution (e.g., 10-12 bit) current-sensing analog-to-digital converter and a simplified on-chip digital control system and still achieve state of charge accuracy that is comparable to a high-resolution coulomb counter or a complicated 'hybrid' system. The intelligent coulomb counter algorithm may switch between a low-power mode during phone standby (or other low-load mode) and a high-accuracy mode during phone activity to balance state of charge accuracy with power savings.

Optionally, programmability may be used to allow the system to be tuned to various batteries and systems for increased accuracy and efficiency. The algorithm may provide raw data for an end-of-line state of charge calculation software to perform battery resistance estimations, thus further improving state of charge accuracy. These features may be provided by monitoring the battery current with a set of counters. Each time a set of current samples are taken and averaged, the average current may be compared to a programmed current threshold and the appropriate counter may be incremented by one. When a counter reaches a programmed value or limit, both counters may be reset and an "overflow" event may be sent to a state machine (e.g., finite state machine or FSM). If a state change is necessary, the state machine may update the state, causing a new set of programmable values to be multiplexed into a digital control and/or timing block/module. Processing of an open circuit voltage (OCV) and resistance measurement may be handled at a state change or transition, if necessary. The state machine for the algorithm may be simple to implement and robust against errors and unexpected inputs. The state machine may achieve this by accepting only counter overflows as inputs and only operating when an overflow is received.

Two primary states and two auxiliary or supplementary states may be used. The primary states may include a low-load state and a high-load state. The algorithm may alternate between the low-load and high-load states as indicated by the counters. The two supplementary states may include an open circuit voltage measurement state and a battery resistance measurement state. The open circuit voltage update state and battery resistance measurement state may be used only briefly. Control may then return to the primary states after a measurement completes or fails.

One advantage of the systems and methods disclosed herein is that the intelligent coulomb counter may fill a marketplace gap between high-end, standalone battery monitoring systems and low-end integrated solutions. For example, the intelligent coulomb counter preserves many of the features of existing high end designs such as resistance estimation, high and low power modes, and accurate state of charge estimation, while still allowing the system to be integrated into existing power management chips (e.g., power management integrated circuit or PMIC chips). The state of charge monitoring features provided by the algorithm may include one or more of the following: separate high accuracy and low power modes (chosen automatically by the intelligent coulomb counter), automated open circuit voltage measurements to reset the coulomb counter and remove integrated error, automated collection of raw data for resistance measurements (that may allow end-of-line software to accurately estimate the unusable charge in the battery), programmability (through a system bus interface (SBI), for example) to best adapt to various batteries and mobile systems and state protection against noise and brief current spikes.

Though many other commercial battery monitoring system solutions exist, they tend to be either standalone solutions with an onboard microprocessor (e.g., Texas Instruments bq27xxx series or Dallas Semiconductor DS 2751), or low-accuracy integrated systems (e.g., voltage-only monitoring). The chips in the first category (standalone solutions with an onboard microprocessor) may provide high accuracy coulomb counting and battery gas gauging. More advanced products (e.g., Texas Instruments bq27541) also provide full state of charge estimations with many additional features such as time remaining estimations, unusable charge correction and resistance measurements. All of these products are standalone packages, occupy a relatively large board space and consume more power than their integrated counterparts. These chips also tend to have elaborate control algorithms run on an integrated microprocessor, which means that it is infeasible to migrate such solutions into a power management circuit- or PMIC-style chip. The other category (low-accuracy integrated systems) may include solutions that do not include a control algorithm and simply report raw battery voltage and/or battery current data to end-of-line state of charge software. This approach may require a software daemon that frequently checks the battery monitoring system front-end and/or provides much lower state of charge accuracy.

The systems and methods disclosed herein may provide a battery monitoring system controller and/or algorithm that may do the following (without software control, for example): reduce power consumption without significantly impacting accuracy, determine when battery voltage has settled sufficiently to use battery voltage as a reliable indicator of state of charge (and use battery voltage as an indicator), collect the necessary data to allow software to calculate an estimate of battery internal resistance, accept an input that may include occasional high-magnitude current spikes during standby (for paging according to Global System for Mobile Communications (GSM) specifications and similar situations, for example) without wasting power or disrupting measurements, be sufficiently programmable to handle different (and potentially unknown) battery chemistries and unusual discharge profiles (e.g., multimedia mode) and store all raw data for state of charge calculation to be read as desired by software. In one configuration, other functions (e.g., calculation of state of charge and learning cycle monitoring) may be handled passively by software on a separate application processor.

The systems and methods disclosed herein may be used to implement an algorithm with a counter-driven state machine (e.g., finite state machine or FSM). In one configuration, each average current (e.g., voltage measurements over a resistor value) measurement may be compared to a threshold and one of two counters may be incremented, depending on whether the current measurement is above or below the threshold. The state machine (e.g., FSM) may receive only counter "overflows" (e.g., when a counter is equal to a threshold or limit) as input. In one example of the systems and methods disclosed herein, the state machine (e.g., FSM) may control a digital multiplexer (MUX), allowing state-by-state programmability. The state machine (e.g., FSM) may signal an open circuit voltage monitoring block/module and a resistance monitoring block/module on certain state transitions. In one configuration, one or more averaging blocks/modules and/or a coulomb counter may use two's complement binary to monitor charging. Additionally or alternatively, a digital comparator may not use two's complement binary.

The state machine (e.g., FSM) may employ a control algorithm (e.g., an intelligent coulomb counter control algorithm) that relies only on counter outputs for state changes. The simplification of the state machine (e.g., FSM) may provide robustness. For example, unexpected inputs may not occur.

The control algorithm may use two main states and two auxiliary states. Each state has a current (e.g., voltage over a sense resistor) threshold level. In one configuration, each threshold level may be adjustable or programmable. The two main states may include a high-load state and a low-load state. For example, the high-load state may loosely correspond to an active state of an electronic device and the low-load state may loosely correspond to a standby state (or other low-load mode) of the electronic device. The auxiliary states may include a resistance measurement state and an open circuit voltage measurement state. A first analog-to-digital converter may only be used during auxiliary states. In one configuration, the first analog-to-digital converter may typically be used for a crystal oscillator.

The low-load state may use lower frequency (e.g., low-duty-cycle) sense voltage (e.g., current or voltage over a sense resistor) monitoring. For example, the low-load state may reduce monitoring power consumption by decreasing measurement frequency during device (e.g., cell phone) standby or during other low, stable load modes (e.g., MP3 playback). The state machine (e.g., FSM) may transition from the low-load state to the high-load state if a high counter reaches a first high counter limit or threshold. A small limit or threshold on the high counter in this state may allow for a quick response to an active load. The state machine (e.g., FSM) may transition from the low-load state to the open circuit voltage measurement state if a low counter reaches a first low counter limit or threshold. A large limit or threshold on the low counter in this state may set a delay before an open circuit voltage update is (first) attempted.

The high-load state may increase accuracy with more frequent sense voltage (e.g., current or voltage over a sense resistor) measurements. For example, the high-load state may increase accuracy with more frequent measurements during active device (e.g., cellular phone) use. The state machine (e.g., FSM) may transition from the high-load state to the low-load state if the low counter reaches a second low counter limit or threshold. A moderate threshold on the low counter in this state may reduce a chance of an incorrect drop to standby. The state machine (e.g., FSM) may transition from the high-load state to the resistance measurement state if the meta counter reaches a second meta counter limit or threshold. An extended period of a high load may be better for resistance measurement data collection.

While in the resistance measurement state, several operations may be performed. Simultaneous battery voltage and current (e.g., voltage over a sense resistor) measurements may be taken. For example, simultaneous battery voltage and current measurements with a large number of samples may be requested. Battery voltage and current (e.g., voltage over a sense resistor or sense voltage) data (that could be used to measure a battery resistance) may be updated. In one configuration, a resistance monitoring block/module may update a resistance monitoring battery voltage measurement (for measured resistance) and update a resistance monitoring sense voltage (e.g., battery current measurement for measured resistance) if a fourth meta counter limit or threshold is reached. For example, these updates may occur if indicated by a sufficiently high battery current (e.g., by a current based on whether it has a high count) or other indicator. It should be noted that the battery voltage data and the current data may only be a portion of measurement data that may be used to measure resistance. The battery monitoring system or circuit may also stand by to update an open circuit voltage measurement (for measured resistance) at a next open circuit voltage measurement state. This may additionally or alternatively occur if a fourth meta counter limit or threshold is reached.

The state machine (e.g., FSM) may transition from the resistance measurement state to the high-load state if the low counter reaches a fourth low counter limit or threshold or the meta counter reaches a fourth meta counter limit or threshold. For example, the fourth low counter limit or threshold may be equal to one. The transition may occur because the resistance measurement has either completed successfully or failed (after a single low measurement). This may allow a device to return to standby. In one configuration, if the transition is triggered by the meta-counter, a resistance monitoring block/module may be signaled. This may be done to indicate or trigger updates to the resistance monitoring battery voltage and resistance monitoring sense voltage (e.g., current) described above, for example. The state machine (e.g., FSM) may transition from the resistance measurement state back to the resistance measurement state if the high counter reaches a fourth high counter limit or threshold. In one configuration, the fourth high counter threshold may be equal to one. In transitioning back to the resistance measurement state, sampling battery voltage and sense voltage (e.g., current) for an accurate resistance measurement may continue.

While in the open circuit voltage measurement state, several operations may be performed. Simultaneous battery voltage and sense voltage (e.g., current or voltage over a sense resistor) measurements may be taken. For example, simultaneous voltage and current measurements with a large number of samples may be requested. If the battery voltage is settled, a first open circuit voltage (e.g., the most recent "good" open circuit voltage) value may be stored. Also, a coulomb counter may be reset (to zero) if the battery voltage is settled. For example, an open circuit voltage monitoring block/module may evaluate the battery voltage and, if indicated, may update the first open circuit voltage data and reset the coulomb counter to zero. For example, this may be indicated if a voltage is settled. The first open circuit voltage measurement may be referred to as a "good open circuit voltage" or simply as an open circuit voltage measurement. In some configurations, the coulomb counter may be reset through a controller. For example, the state machine (e.g., FSM) may provide a signal (from a state transition, for example) to a controller, which may respond by resetting the coulomb counter.

If the battery voltage is settled and if new resistance monitoring battery voltage and resistance monitoring sense voltage (e.g., current) measurements have been taken, then a second open circuit voltage (that could be used to measure battery resistance) may be stored. This second open circuit voltage may be referred to as a resistance monitoring open circuit voltage. The first open circuit voltage may be stored separately from the second open circuit voltage and may be updated at each subsequent open circuit voltage measurement. The second open circuit voltage or resistance monitoring open circuit voltage may be (initially) identical to the first open circuit voltage, but may not be updated at each subsequent open circuit voltage measurement, for example. For example, a resistance monitoring block/module may update the second open circuit voltage (e.g., resistance monitoring open circuit voltage) if indicated. In one example, this update may be indicated if and only if previous resistance monitoring battery voltage and resistance monitoring sense voltage were taken (in a resistance measurement state) and it is the first time an open circuit voltage measurement has been updated since entering a low load state. This may complete the data that could be used to measure battery resistance.

The state machine (e.g., FSM) may transition from the open circuit voltage measurement state to the low-load state if the low counter reaches a third low counter limit or threshold or the meta counter reaches a third meta counter limit or threshold. For example, the third low counter limit may be equal to one. The transition may occur because the open circuit voltage measurement has either completed successfully or failed repeatedly. This may allow a device to return to standby (e.g., a low-load mode). If the transition was triggered by the low counter, an open circuit voltage monitoring block/module may be signaled. This may trigger the voltage monitoring block/module to update the first open circuit voltage (e.g., "good open circuit voltage" or open circuit voltage measurement) and/or a resistance monitoring open circuit voltage (if a battery voltage is settled), for example. The state machine (e.g., FSM) may transition from the open circuit voltage measurement state back to the open circuit voltage measurement state if the high counter reaches a third high counter limit or threshold. For example, the third high counter threshold may be equal to one. In this case, the open circuit voltage measurement may have occurred during a current spike (e.g., modem current spike), so the open circuit voltage measurement may be retried.

Each state may have a separate set of control values. In some configurations, these control values may be adjustable or programmable. One control value may be a delay between measurements (relating to a duty cycle or measurement frequency, for example). Another control value may be a number of samples per average. Another control value may be a current (e.g., sense voltage or voltage over a sense resistor) threshold. Other control values may include counter thresholds or limits, as described above. For example, a high counter may have a high counter threshold or limit for each state, a low counter may have a low counter threshold or limit for each state and a meta counter may have a meta counter threshold or limit for each state. The "high" counter may be incremented if a current measurement is above the current threshold. The "low" counter may be incremented if the current measurement is below the current threshold. The meta counter may be incremented if the high counter reaches its limit.

One example of control values follows. It should be noted that this is just one example and that other values may be used. For the low-load state, a first current (e.g., sense voltage or voltage over a sense resistor) threshold may be 25 mA. The first high counter limit may be eight. This may allow a quick response of a few seconds to active loads, for example. The first low counter limit may be 128. This may allow a two-to-three minute delay between voltage measurements, for example.

For the high-load state, a second current (e.g., sense voltage or voltage over a sense resistor) threshold may be 20 mA. The second high counter limit may be 256. The second low counter limit may be 16. The second meta counter limit may be 256. This may allow a roughly four-minute delay before a battery resistance measurement, for example.

For the open circuit voltage measurement state, a third current (e.g., sense voltage or voltage over a sense resistor) threshold may be 5 mA. The third high counter limit may be one. This may indicate that the load current is too high and that the measurement should be retried, for example. The third low counter limit may be one. This may provide for signaling the open circuit voltage measurement block/module when a valid voltage is measured, for example. The third meta counter limit may be four. Reaching the third meta counter limit may indicate that the open circuit voltage measurement has failed four times and is not valid, for example.

For the resistance measurement state, a fourth current (e.g., sense voltage or voltage over a sense resistor) threshold may be 150 mA. The fourth high counter limit may be one. If reached, this may indicate that the load current is still valid and measurements should continue to be taken, for example. The fourth low counter limit may be one. If reached, this may indicate that the load current has dropped too low and the resistance measurement should be aborted, for example. The fourth meta counter limit may be four. If reached, this may indicate that four subsequent measurements have succeeded, that the data is considered valid and a resistance measurement may be completed with the next valid open circuit voltage measurement update, for example.

Since a battery voltage may slowly settle, a delay may be required between the end of load and an open circuit voltage measurement. The selection of delay time may affect measurement performance. For example, if the delay is too high, the coulomb counter may reset less often, which may cause increased integrated error. However, if the delay is too low, the open circuit voltage measurement may be reset too early, possibly causing an incompletely settled open circuit voltage measurement. Many factors (e.g., aging, temperature, etc.) can alter settling time by up to a factor of 10 or more.

In accordance with the systems and methods disclosed herein, the open circuit voltage may be sampled at a low delay, but its validity may be tested before updating the coulomb counter. For example, the delay may be set to approximately half of battery settling time. During a first open circuit voltage update after load, the open circuit voltage may be measured, with the result stored internally. At subsequent open circuit voltage updates, the new open circuit voltage may be compared to a previous open circuit voltage to determine the slope of the battery voltage. If the current open circuit voltage is less than the previous open circuit voltage (plus a tolerance), the coulomb counter may be reset and the current open circuit voltage may be used for state of charge calculations. In this case, an "open circuit voltage settled" flag may be set to automatically accept further open circuit voltage measurements during standby.

In some configurations, software may be additionally used for post-processing. It should be noted, however, that software is not necessary for application of the systems and methods disclosed herein. For example, software (and a processor) may be used to calculate a state of charge using raw data from a battery monitoring circuit. It may also be used to perform temperature corrections based on thermal data. In one configuration, the software may store and utilize battery specific data, such as an open circuit voltage vs. state of charge curve, temperature coefficients and programmed battery monitoring circuit settings. Software may additionally be used to handle special cases such as a learning cycle and/or initialization. In one configuration, the software may take direct control of the battery monitoring circuit using a "debug mode" and reading analog-to-digital converter outputs through a controller. It should be noted, however, that direct control of the battery monitoring circuit is unnecessary during normal device operation.

In one configuration, the software may compute some basic state of charge equations as illustrated in Equations (1)-(4). The following equations provide examples of how to calculate useful battery metrics from the outputs of a battery monitoring circuit. In order to calculate these metrics, certain other values regarding the battery may be provided for performing these calculations. Some of the values illustrated may be either system-specific or battery specific, and may be stored in non-volatile memory and loaded when a state of charge algorithm is initialized.

$$R_{batt} = \frac{V_{B2} - V_{B1}}{V_{S1}} * R_{sense} \qquad (1)$$

In Equation (1), $R_{batt}$ is a battery (internal) resistance, $V_{B2}$ is a resistance monitoring open circuit voltage (provided by a resistance monitoring block/module, for example), $V_{B1}$ is a resistance monitoring battery voltage, $V_{S1}$ is a resistance monitoring sense voltage (e.g., a battery current measurement) and $R_{sense}$ is a sense resistor value or measurement. For example, $R_{sense}$ may be the value (in $\Omega$) of the sense resistor that produces a sense voltage.

$$UUC = FCC * Lookup(R_{batt} * I_{test} + V_{failure}) \qquad (2)$$

In Equation (2), UUC is an unusable capacity, FCC is a full charge capacity of a battery, Lookup is a lookup function, $I_{test}$ is a current at which an unusable charge cutoff may be calculated (an approximate peak system current may be used to not underestimate the unusable charge, for example) and $V_{failure}$ is a voltage at which point the battery may be considered "empty" for a device and below, where the device no longer operates. FCC may be extracted from a battery in an ideal circuit after a full charge cycle, for example. FCC may be programmed or learned through monitoring of charging cycles, for instance. In some configurations, the Lookup function returns an approximate state of charge percentage when provided a voltage. A state of charge versus open circuit voltage table or piecewise linear (or higher order) approximation specific to a battery may be provided. UUC or unusable charge may represent stored charge that is made inaccessible due to a voltage drop across $R_{batt}$ pushing battery voltage below a device's cutoff voltage, $V_{failure}$.

$$RUC = \text{Lookup}(OCV) * FCC - \frac{CC}{R_{sense}} - UUC \quad (3)$$

In Equation (3), RUC is a remaining usable capacity, OCV is an open circuit voltage measurement and CC is an amount of consumed charge. It should be noted that the coulomb counter may measure the consumed charge since the last good open circuit voltage update (hence the reset mentioned above). CC may be the present coulomb counter reading, unit-adjusted to match the units in the equation (e.g., adjusted for measurement frequency, bits in an analog-to-digital converter (ADC), etc.).

$$SoC = \frac{RUC}{FCC - UUC} \quad (4)$$

In Equation (4), SoC is a state of charge. The state of charge (SoC) may be a percentage that reports the remaining usable capacity on a scale from 100% to 0%. This metric may be useful for reports to an end-user.

In one configuration, an initialization state or mode may be considered. In this initialization state, a battery monitoring circuit may not track the state of charge while a device (e.g., cellular phone) is turned off. This may also happen during a self-discharge or battery swap. An initialization procedure may be used to calculate an initial state of charge estimate. It should be noted that a small (e.g., less than five percent) open circuit voltage error may exist in an initial measurement due to a current load. The error may be corrected at a first normal open circuit voltage update.

In one configuration, a learning cycle state or mode may be considered. As noted above, the full charge capacity (FCC) of batteries may be lost with extended use. A "learning cycle" state or mode may be used to measure an amount of charge restored during charging. It should be noted that a complete discharge may not be necessary for this measurement. A running average of learning cycle results may provide an updated full charge capacity (FCC) measurement for future use in algorithms.

The systems and methods disclosed herein may provide a good tradeoff between system complexity and state of charge accuracy. In accordance with the systems and methods disclosed herein, no system changes may be needed to adapt to a current set of batteries. It should also be noted that small errors in a battery monitoring circuit configuration due to errors in battery models may not significantly impact accuracy. As described above, a state machine may use high and low counter ticks to initiate state changes. The systems and methods disclosed herein may protect against noise and transients, may allow programmable delays and may use a simple state machine with few inputs for robustness.

Various configurations are now described with reference to the Figures, where like reference numbers may indicate functionally similar elements. The systems and methods as generally described and illustrated in the Figures herein could be arranged and designed in a wide variety of different configurations. Thus, the following more detailed description of several configurations, as represented in the Figures, is not intended to limit scope, as claimed, but is merely representative of the systems and methods.

FIG. 1 is a block diagram illustrating one configuration of a battery monitoring circuit 102. The battery monitoring circuit 102 may include averaging block/module A 134, averaging block/module B 136, a coulomb counter 142, an open circuit voltage monitoring block/module 146, a resistance monitoring block/module 150, a comparator 170, a high counter 176, a low counter 178, a meta counter 186, a state machine 190, output registers 158, a controller 109, a multiplexer 105 and/or a settings block/module 101. In one configuration, the battery monitoring circuit 102 may be coupled to analog-to-digital converter A 126, analog-to-digital converter B 128, low pass filter A 114, low pass filter B 116 and/or a battery 104. In another configuration, the battery monitoring circuit 102 may include analog-to-digital converter B 128. It should be noted that each of the elements included within the battery monitoring circuit 102 may be implemented in circuitry (with integrated circuit components, for example).

The battery 104 may be an energy source that is monitored by the battery monitoring circuit 102. Examples of the battery 104 include alkaline batteries, lithium batteries, lithium-ion batteries, polymer-based batteries and others. The battery 104 may also include or be coupled to circuitry (e.g., a sense resistor) used to measure a voltage. A battery voltage may be measured between the terminals of the battery 104. The battery voltage may be measured differentially between the terminals of the battery. For example, a positive terminal 106 and a negative terminal 108 of the battery may be coupled to low pass filter A 114. Low pass filter A 114 may be coupled to analog-to-digital converter A 126. In some configurations, analog-to-digital converter A 126 may be an analog-to-digital converter that is used for other functions not performed by the battery monitoring circuit 102. For example, analog-to-digital converter A 126 may be used to measure a crystal oscillator and for other functions.

Low pass filter A 114 may provide a filtered positive signal 120 and a filtered negative signal 118 to analog-to-digital converter A 126. Analog-to-digital converter A 126 may be coupled to averaging block/module A 134. Analog-to-digital converter A 126 may convert the positive signal 120 and negative signal 118 into a digital battery voltage 130 (e.g., a quantized battery voltage measurement) that is provided to averaging block/module A 134.

The battery 104 may be coupled to low pass filter B 116. An analog sense voltage 110 (over a "sense resistor") and a ground terminal 112 may be provided from the battery 104. For example, the battery 104 may be coupled to a sense resistor that is coupled to a ground terminal 112. The sense voltage 110 may be a voltage taken from between a terminal of the battery 104 and the sense resistor. This sense voltage may provide direct information on the battery current to analog-to-digital converter B 128 and the battery monitoring circuit 102. Thus, the sense voltage 110 and ground terminal 112 may provide a sense voltage 110 that is measured over the sense resistor. The sense voltage 110 and the ground terminal 112 may be provided to low pass filter B 116. Low pass filter B 116 may be coupled to analog-to-digital converter B 128. Low pass filter B 116 may provide a filtered sense voltage 122 and filtered ground 124 to analog-to-digital converter B 128. Analog-to-digital converter B 128 may convert the filtered sense voltage 122 and the filtered ground 124 into a digital sense voltage 132 (e.g., a quantized sense voltage measurement) that is provided to averaging block/module B 136. In some configurations, the one or more analog-to-digital converters 126, 128 sense the "sense voltage" and the "battery voltage."

Averaging block/module A 134 may be coupled to an open circuit voltage monitoring block/module 146. Averaging block/module A 134 may average a number of digital voltage 130 samples to provide a battery voltage 138 (e.g., an averaged voltage) measurement to the open circuit voltage monitoring block/module 146.

Averaging block/module B 136 may be coupled to a resistance monitoring block/module 150, to a coulomb counter 142 and/or to a comparator 170. Averaging block/module B 136 may average a number of digital sense voltage 132 samples to provide a sense voltage 140 (e.g., an averaged sense voltage) measurement to the resistance monitoring block/module 150. It should be noted that the sense voltage 140 may also be referred to as a battery current. This is because the sense voltage 140 may be used to derive a battery current based on the resistance of the sense resistor.

The coulomb counter 142 may be coupled to the output registers 158. The coulomb counter 142 may be used to measure consumed charge. For example, the coulomb counter 142 may measure a consumed charge based on the sense voltage 140 (e.g., battery current). The coulomb counter 142 may provide a consumed charge measurement 154 to the output registers 158. The coulomb counter 142 may be reset each time an open circuit voltage measurement is taken in order to reduce integrated error.

More detail on some possible configurations of the coulomb counter 142 is given hereafter. Although current waveforms in portable equipment are complex, only the integral of the current waveform may be of interest. Waveform reconstruction may be unnecessary. Therefore, all frequency information may be discarded as long as an accurate count of the net charge is maintained. A coulomb counting analog-to-digital converter may be implemented using a voltage frequency converter (VFC) or a sigma delta analog-to-digital converter. A voltage frequency converter is a current integrator that integrates current in and out of a battery. It converts the current information into pulses. The frequency of the pulses may be proportional to the total current integrated. Alternatively, a sampling system such as a sigma delta analog-to-digital converter may achieve the same goal with better accuracy as long as certain criteria can be met.

The comparator 170 may be coupled to the high counter 176 and to the low counter 178. The comparator 170 may compare the sense voltage 140 (e.g., battery 104 current) to a threshold 113. When the sense voltage 140 or battery current is higher than or above the threshold 113, the comparator 170 may provide a high increment signal 172 to the high counter 176 that causes the high counter 176 to increment. When the sense voltage 140 or battery current is lower than or below the threshold 113, the comparator 170 may provide a low increment signal 174 to the low counter 178 that causes the low counter 178 to increment. In one configuration, the high counter 176 and the low counter 178 are register counters.

The low counter 178 may be coupled to the high counter 176 and to the state machine 190. The low counter 178 may use a set of limits or thresholds based on the state of the state machine 190. For example, the low counter 178 may use a limit or threshold for each state. When the low counter 178 is incremented to its (current state) limit (e.g., when the low counter's 178 count is equal to its limit), the low counter 178 may provide a low counter "overflow" signal 184 to the state machine 190. When this occurs, the low counter 178 may reset and the low counter 178 may also provide a reset signal 180 to the high counter 176 that causes the high counter 176 to reset (to zero).

The high counter 176 may be coupled to the low counter 178, to the meta counter 186 and/or to the state machine 190. The high counter 176 may use a set of limits or thresholds based on the state of the state machine 190. For example, the high counter 176 may use a limit or threshold for each state. When the high counter 176 is incremented to its (current state) limit (e.g., when the high counter's 176 count is equal to its limit), the high counter 176 may provide a high counter "overflow" signal 182 to the state machine 190 and/or to the meta counter 186. When this occurs, the high counter 176 may reset and may also provide a reset signal 129 to the low counter 178 that causes the low counter 178 to reset (to zero).

The meta counter 186 may be coupled to the state machine 190. The meta counter 186 may be incremented based on the overflow signal 182 from the high counter 176. For example, when the high counter 176 provides the overflow signal 182, the meta counter 186 is incremented. The meta counter 186 may use a set of limits or thresholds based on the state of the state machine 190. For example, the meta counter 186 may use a limit or threshold for one or more states. When the meta counter 186 is incremented to its (current state) limit (e.g., when the meta counter's 186 count is equal to its limit), the meta counter 186 may provide a meta counter "overflow" signal 188 to the state machine 190. When this occurs, the meta counter 186 may reset (to zero).

The state machine 190 may be coupled to the meta counter 186, to the open circuit voltage monitoring block/module 146, to the resistance monitoring block/module 150 and/or to the multiplexer 105. One example of the state machine 190 is a finite state machine (FSM). Using a fully internal state machine 190 may ensure that the battery monitoring circuit 102 can operate autonomously, thereby reducing the need for software interaction and ensuring low power operation. The state machine 190 may determine a state based on the low counter overflow signal 184, the high counter overflow signal 182 and/or the meta counter overflow signal 188. In some configurations, the state machine 190 may provide a present state signal 144 to the multiplexer 105. Additionally or alternatively, the state machine 190 may provide a resistance monitoring control signal 194 to the resistance monitoring block/module 150 and/or may provide an open circuit voltage monitoring control signal 196 to the open circuit voltage monitoring block/module 146. The state machine 190 may provide a meta counter reset signal 192 to reset the meta counter 186 at one or more state transitions. Additionally or alternatively, the state machine 190 may provide the meta counter reset signal 192 to reset the meta counter 186 when a high counter overflow signal 182, a low counter overflow signal 184 and/or a meta counter overflow signal 188 is received.

The open circuit voltage monitoring block/module 146 may be coupled to the output registers 158 and to the resistance monitoring block/module 150. The open circuit voltage monitoring block/module 146 may be used to measure a battery voltage 138. For example, the open circuit voltage monitoring block/module 146 may provide an open circuit voltage measurement 152 to the output registers 158. Additionally or alternatively, the open circuit voltage monitoring block/module 146 may provide voltage measurements 148 to the resistance monitoring block/module 150. The voltage measurements 148 may include a resistance monitoring open circuit voltage measurement and/or a battery voltage (for resistance monitoring).

The open circuit voltage monitoring block/module 146 may determine whether the battery voltage 138 is settled. This may be done to ensure reliable open circuit voltage measurements. In one configuration, the battery voltage 138 may be sampled at a low delay, but its validity may be tested before updating the coulomb counter 142. For example, the delay may be set to approximately half of battery 104 settling time. During a first open circuit voltage update after load, an initial open circuit voltage may be measured by the open circuit voltage monitoring block/module 146, with the result stored internally. At subsequent open circuit voltage updates, the new open circuit voltage may be compared to a previous open circuit voltage to determine the slope of the battery voltage 138. If the current open circuit voltage is less than the previous open circuit voltage (plus a tolerance), the coulomb counter 142 may be reset and the new open circuit voltage may be used to provide an updated open circuit voltage measurement 152 to the output registers 158. In this case, an "open circuit voltage settled" flag may be set to automatically accept further open circuit voltage measurements during standby.

The resistance monitoring block/module 150 may be coupled to the output registers 158. The resistance monitoring block/module 150 may provide measurements 156 to the output registers 158. The measurements 156 may include a resistance monitoring open circuit voltage, a resistance monitoring battery voltage and/or a resistance monitoring sense voltage (or corresponding measurements, for example). Resistance measurement may be used for improved state of charge accuracy. The resistance monitoring block/module 150 may receive a resistance monitoring open circuit voltage measurement and/or a voltage (for resistance monitoring) from the open circuit voltage monitoring block/module 146. For example, the resistance monitoring block/module 150 may provide the resistance monitoring open circuit voltage to the output registers 158 based on the resistance monitoring open circuit voltage measurement received from the open circuit voltage monitoring block/module 146. Furthermore, the resistance monitoring block/module 150 may provide the resistance monitoring voltage to the output registers 158 based on the voltage (for resistance monitoring) received from the open circuit voltage monitoring block/module 146. The resistance monitoring block/module 150 may additionally or alternatively provide a resistance monitoring sense voltage to the output registers 158 based on the sense voltage 140.

The output registers 158 may store and/or output measurement data. In one configuration, the output registers 158 may provide the output data to a processor for further calculations. The output registers 158 may receive and store an open circuit voltage measurement 152, a consumed charge measurement 154 and/or measurements 156 (including a resistance monitoring open circuit voltage, a resistance monitoring voltage and/or a resistance monitoring sense voltage, for example). The output registers 158 may thus provide open circuit voltage data 160, consumed charge data 162, resistance monitoring open circuit voltage data 164, resistance monitoring battery voltage data 166 and/or resistance monitoring sense voltage data 168 to another block/module (e.g., a processor).

In one configuration, the battery monitoring circuit 102 records several values, which may be outputted via the output registers 158 (e.g., two read-only system bus interface (SBI) registers 158). In one configuration, the consumed charge data 162 may be an accumulated charge (e.g., CC as described above). The coulomb counter 142 may accumulate the charge removed from the battery 104 since the last open circuit voltage update and coulomb counter 142 reset. In one implementation, the coulomb counter 142 updates at a period of 55*T32k, where the frequency of T32k is $f_{tcxo}/586=19.2$ megahertz (MHz)/586=32.7645 kilohertz (kHz).

In one configuration, the open circuit voltage data 160 is a last "good" open circuit voltage for a state of charge. When the open circuit voltage monitoring block/module 146 validates an open-circuit voltage measurement 152, for example, this value may be updated and the coulomb counter 142 may be reset. This open circuit voltage data 160 may provide a baseline state of charge that is adjusted by an accumulated charge value (e.g., consumed charge data 162).

The resistance monitoring battery voltage data 166 (e.g., $V_{B1}$) may be recorded by the resistance monitoring block/module 150 when the battery current remains high for a sufficient duration. Subsequent measurements may replace the stored measurement. The resistance monitoring battery voltage data 166 may be used to calculate a voltage drop across the battery 104 internal resistance.

The resistance monitoring sense voltage data 168 (e.g., $V_{S1}$) may be recorded by the resistance monitoring block/module 150 simultaneously with the resistance monitoring battery voltage data 166 (e.g., $V_{B1}$). Subsequent measurements may replace the stored measurement. The resistance monitoring sense voltage data 168 may be a measurement of a high current that is used to calculate the battery 104 internal resistance.

The resistance monitoring open circuit voltage data 164 (e.g., $V_{B2}$) may be recorded by the resistance monitoring block/module 150, triggered by the first validated open circuit voltage to occur after the resistance monitoring battery voltage data 166 and the resistance monitoring sense voltage data 168 are taken. In one configuration, when the resistance monitoring open circuit voltage data 164 is not zero, data that may be used to calculate battery internal resistance may be ready and valid. The resistance monitoring open circuit voltage data 164 may be zeroed when resistance calculation data has not yet been captured or is in progress. The resistance monitoring open circuit voltage data 164 may be used to calculate the voltage drop across the battery 104 internal resistance.

In one configuration, the state machine 190 may use two main states and two auxiliary states. The two main states may include a high-load state and a low-load state. The auxiliary states may include a resistance measurement state and an open circuit voltage measurement state. Analog-to-digital converter A 126 may only be used by the battery monitoring circuit 102 during auxiliary states. In one configuration, analog-to-digital converter A 126 may typically be used for a crystal oscillator.

The low-load state may use lower frequency (e.g., low-duty-cycle) current (e.g., sense voltage 140) monitoring. For example, the low-load state may reduce monitoring power consumption by decreasing measurement frequency during device (e.g., cell phone) standby. The state machine 190 (e.g., FSM) may transition from the low-load state to the high-load state if the high counter 176 reaches a first high counter limit or threshold. A small limit or threshold on the high counter 176 in the low-load state may allow for a quick response to an active load. The state machine 190 (e.g., FSM) may transition from the low-load state to the open circuit voltage measurement state if a low counter 178 reaches a first low counter limit or threshold. A large limit or threshold on the low counter 178 in this state may set a delay before an open circuit voltage update is (first) attempted.

The high-load state may increase accuracy with more frequent current (e.g., voltage over a sense resistor) measurements. For example, the high-load state may increase accuracy with more frequent measurements during active device (e.g., cellular phone) use. The state machine 190 (e.g., FSM) may transition from the high-load state to the low-load state if the low counter 178 reaches a second low counter limit or threshold. A moderate threshold on the low counter 178 in this state may reduce a chance of an incorrect drop to standby. The state machine 190 (e.g., FSM) may transition from the high-load state to the resistance measurement state if the meta counter 186 reaches a second meta counter limit or threshold. An extended period of a high load may be better for resistance measurement data collection.

While in the resistance measurement state, several operations may be performed. Simultaneous battery voltage 138 and current (e.g., sense voltage 140) measurements may be taken. For example, simultaneous battery voltage 138 and current (e.g., sense voltage 140) measurements with a large number of samples may be requested. Battery voltage 138 and current (e.g., sense voltage 140) data (that could be used to measure a battery resistance) may be updated. In one configuration, the resistance monitoring block/module 150 may update a resistance monitoring battery voltage measurement (for measured resistance) and update a resistance monitoring sense voltage (e.g., battery current measurement for measured resistance) if a fourth meta counter limit or threshold is reached. It should be noted that the voltage data and the current data may only be a portion of measurement data that may be used to measure resistance. The battery monitoring circuit 102 may also stand by to update an open circuit voltage measurement (for measured resistance) at a next open circuit voltage measurement state. This may additionally or alternatively occur if a fourth meta counter limit or threshold is reached.

The state machine 190 (e.g., FSM) may transition from the resistance measurement state to the high-load state if the low counter 178 reaches a fourth low counter limit or threshold or the meta counter 186 reaches a fourth meta counter limit or threshold. For example, the fourth low counter limit or threshold may be equal to one in the resistance measurement state. The transition may occur because the resistance measurement has either completed successfully or failed (after a single low measurement). This may allow a device to return to standby. In one configuration, if the transition is triggered by the meta counter 186, the resistance monitoring block/module 150 may be signaled. This may be done to indicate or trigger updates to the resistance monitoring battery voltage and resistance monitoring sense voltage (e.g., current), for example. The state machine 190 (e.g., FSM) may transition from the resistance measurement state back to the resistance measurement state if the high counter 176 reaches a fourth high counter limit or threshold. In one configuration, the fourth high counter threshold may be equal to one. In this case, the battery monitoring circuit 102 may continue sampling current and voltage for an accurate resistance measurement.

While in the open circuit voltage measurement state, several operations may be performed. Simultaneous battery voltage 138 and current (e.g., sense voltage 140) measurements may be taken. For example, simultaneous battery voltage 138 and current (e.g., sense voltage 140) measurements with a large number of samples may be requested. If the battery voltage is settled, a first open circuit voltage (e.g., the most recent "good" open circuit voltage) value may be stored. Also, the coulomb counter 142 may be reset (to zero) if the battery voltage is settled. For example, the open circuit voltage monitoring block/module 146 may evaluate the battery voltage 138 and, if indicated, may update the first open circuit voltage data 160 and reset the coulomb counter 142 to zero. Furthermore, if the battery voltage is settled and if new voltage and current measurements (that could be used to measure battery resistance) have been taken, then second open circuit voltage data 164 (representing resistance monitoring open circuit voltage, for example) may be stored. For example, the resistance monitoring block/module 150 may update the second open circuit voltage (that could be used to measure battery resistance) if indicated. In one example, this update may be indicated if and only if previous resistance monitoring battery voltage and resistance monitoring sense voltage were taken (in a resistance measurement state) and it is the first time an open circuit voltage measurement has been updated since entering a low load state. This may complete the data that could be used to measure battery resistance.

The state machine 190 (e.g., FSM) may transition from the open circuit voltage measurement state to the low-load state if the low counter 178 reaches a third low counter limit or threshold or the meta counter 186 reaches a third meta counter limit or threshold. For example, the third low counter limit may be equal to one. The transition may occur because the open circuit voltage measurement has either completed successfully or failed repeatedly. This may allow a device to return to standby (e.g., a low-load mode). If the transition was triggered by the low counter 178, the state machine 190 may send an open circuit voltage monitoring signal 196 to the open circuit voltage monitoring block/module 146. This may trigger the open circuit voltage monitoring block/module 146 to update the open circuit voltage measurement 152 and/or a resistance monitoring open circuit voltage (if a battery voltage is settled), for example. The state machine 190 (e.g., FSM) may transition from the open circuit voltage measurement state back to the open circuit voltage measurement state if the high counter 176 reaches a third high counter limit or threshold. For example, the third high counter threshold may be equal to one. In this case, the open circuit voltage measurement may have occurred during a current spike (e.g., modem current spike), so the open circuit voltage measurement may be retried.

The multiplexer 105 may be coupled to a settings block/module 101 and to a controller 109. The settings block/module 101 may store settings for the operation of the battery monitoring circuit 102. One example of the settings block/module 101 is a system bus interface (SBI). The settings block/module 101 may receive settings input 198. The settings input 198 may include settings information that may be stored by the settings block/module 101 such as operation timing information (e.g., delay(s) between measurements, duty cycle(s), etc.), limits or thresholds for one or more states of the high counter 176 and the low counter 178, one or more sense voltage (e.g., battery current) thresholds and/or one or more numbers of samples per average, etc. The settings block/module 101 may provide the stored settings information 103 to the multiplexer 105. Thus, the battery monitoring circuit 102 may be user-programmable in that it may store settings that may be varied. For instance, the settings block/module 101 may store separate settings for active and standby modes of an electronic device.

In one configuration, the state machine 190 may provide a present state indication 144 to the multiplexer 105. The multiplexer 105 may provide selected settings information 107 to the controller 109 based on the present state indication 144. For example, the multiplexer 105 may select one or more pieces of settings information 103 to be provided to the controller 109 as selected settings information 107. The selected settings information 107 may include information that is relevant to a present state and/or state transition.

In one configuration, the controller 109 may control (e.g., provide control information to) one or more elements of the battery monitoring circuit 102 based on the selected settings information 107. In one configuration, the controller 109 is a digital controller that handles timing and forwards decoded programmable settings to modules, elements or components of the battery monitoring circuit 102. For example, the controller 109 may be coupled to analog-to-digital converter B 128, to averaging block/module A 134, to averaging block/module B 136, to the open circuit voltage monitoring block/module 146, to the coulomb counter 142, to the resistance monitoring block/module 150, to the high counter 176, to the comparator 170 and/or to the low counter 178. Additionally or alternatively, the controller 109 may be coupled to analog-to-digital converter A 126.

The controller 109 may send a measurement request 133 to analog-to-digital converter A 126 that causes analog-to-digital converter A 126 to provide the digital battery voltage 130 to averaging block/module A 134. This may be done at a frequency based on the present state of the state machine 190.

The controller 109 may send a measurement request 127 to analog-to-digital converter B 128 that causes analog-to-digital converter B 128 to provide the digital sense voltage 132 to averaging block/module B 136. This may be done at a frequency based on the present state of the state machine 190.

The controller 109 may control averaging block/module A 134 and averaging block/module B 136. For example, the controller 109 may send a first number 125 to averaging block/module A 134. Averaging block/module A 134 may average a number of digital battery voltage 130 samples corresponding to the first number 125. Additionally or alternatively, the controller 109 may send a second number 123 to averaging block/module B 136. Averaging block/module B 136 may average a number of digital sense voltage 132 samples corresponding to the second number 123.

The controller 109 may communicate information 121 with the open circuit voltage monitoring block/module 146. For example, the controller 109 may send information 121 to the open circuit voltage monitoring block/module 146 and/or may receive information 121 from the open circuit voltage monitoring block/module 146. In one configuration, the open circuit voltage monitoring block/module 146 may send information 121 to the controller 109 indicating that the coulomb counter 142 should be reset. This may occur when an open circuit voltage measurement 152 is updated and/or provided to the output registers 158. The controller 109 may use this information 121 to send a reset signal 119 to the coulomb counter 142.

The controller 109 may optionally send control information 121, 117 to the open circuit voltage monitoring block/module 146 and/or the resistance monitoring block/module 150. For example, the controller 109 may send synchronization and/or timing information 121, 117 to the open circuit monitoring block/module 146 and/or the resistance monitoring block/module 150.

The controller 109 may provide a high counter limit or threshold 115 to the high counter 176. For example, the high counter limit or threshold 115 used by the high counter 176 may depend on the present state of the state machine 190. For instance, the controller 109 may provide one or more high counter limits or thresholds 115 to the high counter 176 based on the present state.

The controller 109 may provide a low counter limit or threshold 111 to the low counter 178. For example, the low counter limit or threshold 111 used by the low counter 178 may depend on the present state of the state machine 190. For instance, the controller 109 may provide one or more low counter limits or thresholds 111 to the low counter 178 based on the present state.

The controller 109 may provide a threshold 113 (e.g., a battery current threshold or sense voltage threshold) to the comparator 170. For example, the threshold 113 used by the comparator 170 may depend on the present state of the state machine 190. For instance, the controller 109 may provide one or more thresholds 113 to the comparator 170 based on the present state.

It should be noted that the battery monitoring circuit 102 may operate autonomously or independently from a software processor. As used herein, a "software processor" may be a processor that is capable of executing compiled code. Examples of a software processor include a general-purpose microprocessor and an application processor on a mobile device. For example, the operation of the battery monitoring circuit 102 may generally be controlled by the controller 109 and the state machine 190. In one configuration, the controller 109 and the state machine 190 may not be "software processors." Rather, the controller 109 may only provide programmable variable values and operations (provided by the settings block/module 101 and the multiplexer 105) such as operating speeds, counter limits and sense voltage or current thresholds. In one configuration, the battery monitoring circuit 102 and/or elements of the battery monitoring circuit 102 may be application specific integrated circuits (ASICs). Thus, for example, the battery monitoring circuit 102 may only be programmable to the extent of varying counter limits or thresholds, sense voltage or current thresholds (for the comparator 170), and speed of operation. This may provide sufficient flexibility to adapt the system to differing provided batteries and/or load profiles.

Figure 2:
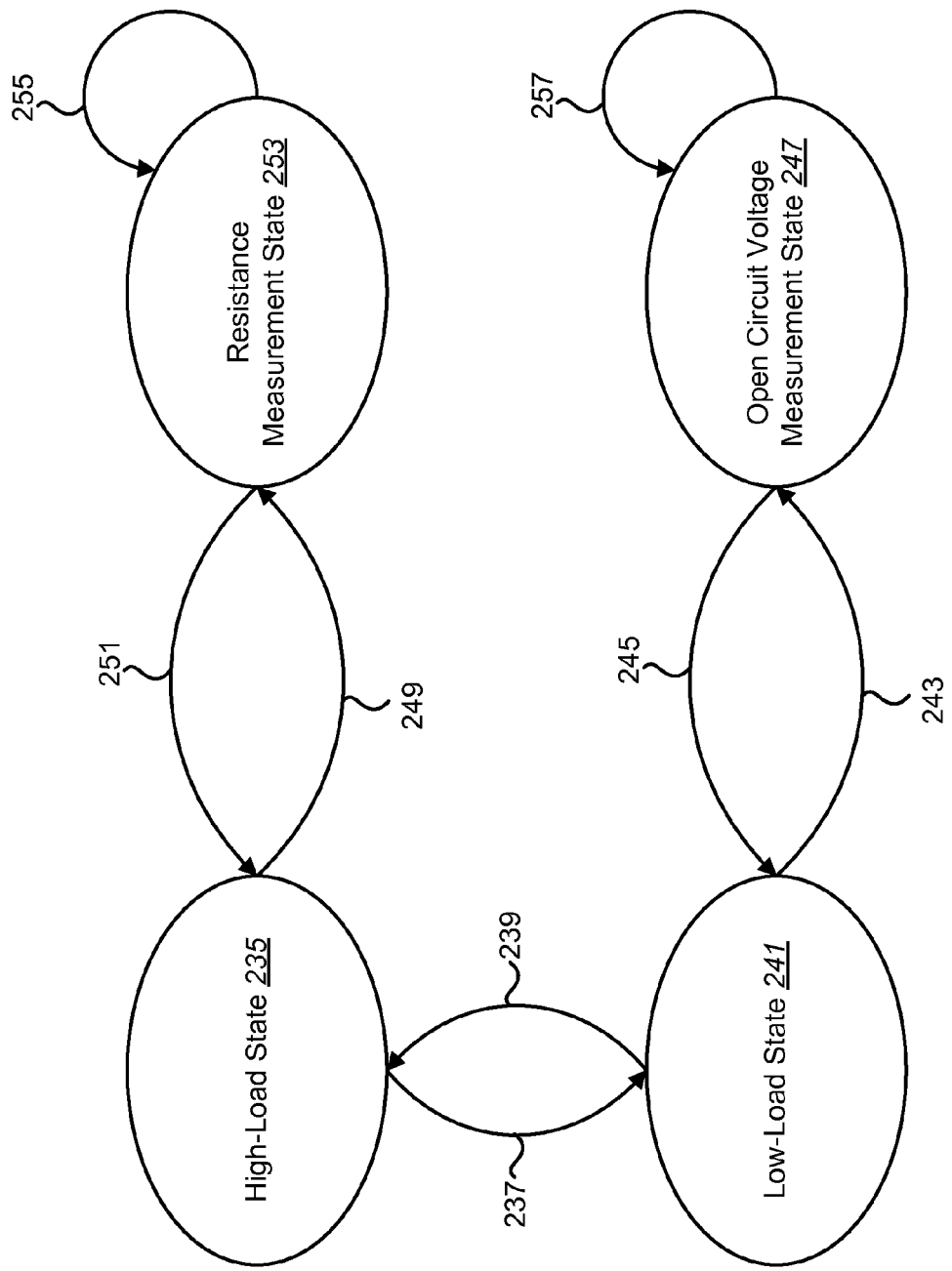
FIG. 2 is a state diagram illustrating one configuration of states that may be used in accordance with the systems and methods disclosed herein.

FIG. 2 is a state diagram illustrating one configuration of states that may be used in accordance with the systems and methods disclosed herein. For example, the states 235, 241, 247, 253 may represent states of the state machine 190 and/or the battery monitoring circuit 102 illustrated in FIG. 1.

For example, the state machine 190 may use two main states and two auxiliary states. The two main states may include a high-load state 235 and a low-load state 241. The auxiliary states may include a resistance measurement state 253 and an open circuit voltage measurement state 247. In one configuration, analog-to-digital converter A 126 may only be used by the battery monitoring circuit 102 during auxiliary states. For instance, analog-to-digital converter A 126 may typically be used for a crystal oscillator.

The low-load state 241 may use lower frequency (e.g., low-duty-cycle) current (e.g., sense voltage 140) monitoring. For example, the low-load state 241 may reduce monitoring power consumption by decreasing measurement frequency during device (e.g., cell phone) standby. The state machine 190 (e.g., FSM) may make a first transition 237 from the low-load state 241 to the high-load state 235 if the high counter 176 reaches a first high counter limit or threshold. A small limit or threshold on the high counter 176 in the low-load state 241 may allow for a quick response to an active load. The state machine 190 (e.g., FSM) may make a fourth transition 243 from the low-load state 241 to the open circuit voltage measurement state 247 if a low counter 178 reaches a first low counter limit or threshold. A large limit or threshold on the low counter 178 in this state 241 may set a delay before an open circuit voltage update is (first) attempted.

The high-load state 235 may increase accuracy with more frequent current (e.g., voltage over a sense resistor) measurements. For example, the high-load state 235 may increase accuracy with more frequent measurements during active device (e.g., cellular phone) use. The state machine 190 (e.g., FSM) may make a second transition 239 from the high-load state 235 to the low-load state 241 if the low counter 178 reaches a second low counter limit or threshold. A moderate threshold on the low counter 178 in this state may reduce a chance of an incorrect drop to standby. The state machine 190 (e.g., FSM) may make a sixth transition 249 from the high-load state 235 to the resistance measurement state 253 if the meta counter 186 reaches a second meta counter limit or threshold. An extended period of a high load may be better for resistance measurement data collection.

While in the resistance measurement state 253, several operations may be performed. Simultaneous battery voltage 138 and current (e.g., sense voltage 140) measurements may be taken. For example, simultaneous battery voltage 138 and current (e.g., sense voltage 140) measurements with a large number of samples may be requested. Battery voltage 138 and current (e.g., sense voltage 140) data (that could be used to measure a battery resistance) may be updated. For example, if indicated, the resistance monitoring block/module 150 may update a battery voltage 138 measurement (for measured resistance) and update a battery current (e.g., sense voltage 140) measurement (for measured resistance). It should be noted that the voltage data and the current data may only be a portion of measurement data that may be used to measure resistance. The battery monitoring circuit 102 may also stand by to update an open circuit voltage measurement (for measured resistance) at a next open circuit voltage measurement state 247.

The state machine 190 (e.g., FSM) may make a seventh transition 251 from the resistance measurement state 253 to the high-load state 235 if the low counter 178 reaches a fourth low counter limit or threshold or the meta counter 186 reaches a fourth meta counter limit or threshold. For example, the fourth low counter limit or threshold may be equal to one in the resistance measurement state 253. The seventh transition 251 may occur because the resistance measurement has either completed successfully or failed (after a single low measurement). In one configuration, if the seventh transition 251 is triggered by the meta counter 186, the resistance monitoring block/module 150 may be signaled. The state machine 190 (e.g., FSM) may make an eighth transition 255 from the resistance measurement state 253 back to the resistance measurement state 253 if the high counter 176 reaches a fourth high counter limit or threshold. In one configuration, the fourth high counter threshold may be equal to one. In making the eighth transition 255, the battery monitoring circuit 102 may continue sampling current and voltage for an accurate resistance measurement.

While in the open circuit voltage measurement state 247, several operations may be performed. Simultaneous battery voltage 138 and current (e.g., sense voltage 140) measurements may be taken. For example, simultaneous battery voltage 138 and current (e.g., sense voltage 140) measurements with a large number of samples may be requested. If the battery voltage is settled, a first open circuit voltage (e.g., the most recent "good" open circuit voltage) value may be stored. Also, the coulomb counter 142 may be reset (to zero) if the battery voltage is settled. For example, the open circuit voltage monitoring block/module 146 may evaluate the battery voltage 138 and, if indicated, may update the first open circuit voltage data and reset the coulomb counter 142 to zero. Furthermore, if the battery voltage is settled and if new voltage and current measurements (that could be used to measure battery resistance) have been taken, then a second open circuit voltage (that could be used to measure battery resistance) may be stored. For example, the resistance monitoring block/module 150 may update the second open circuit voltage (that could be used to measure battery resistance) if indicated. This may complete the data that could be used to measure battery resistance.

The state machine 190 (e.g., FSM) may make a fourth transition 245 from the open circuit voltage measurement state 247 to the low-load state 241 if the low counter 178 reaches a third low counter limit or threshold or the meta counter 186 reaches a third meta counter limit or threshold. For example, the third low counter limit may be equal to one. The fourth transition 245 may occur because the open circuit voltage measurement has either completed successfully or failed repeatedly, so operation may return to the low-load state. In some configurations, the low-load state may correspond to a standby state or any other low-load mode (e.g., MP3 playback) in periods of low power consumption on a device, for example. If the fourth transition 245 was triggered by the low counter 178, the state machine 190 may send an open circuit voltage monitoring signal 196 to the open circuit voltage monitoring block/module 146. The state machine 190 (e.g., FSM) may make a fifth transition 257 from the open circuit voltage measurement state 247 back to the open circuit voltage measurement state 247 if the high counter 176 reaches a third high counter limit or threshold. For example, the third high counter threshold may be equal to one. In this case, the open circuit voltage measurement may have occurred during a current spike (e.g., modem current spike), so the open circuit voltage measurement may be retried.

Figure 3:
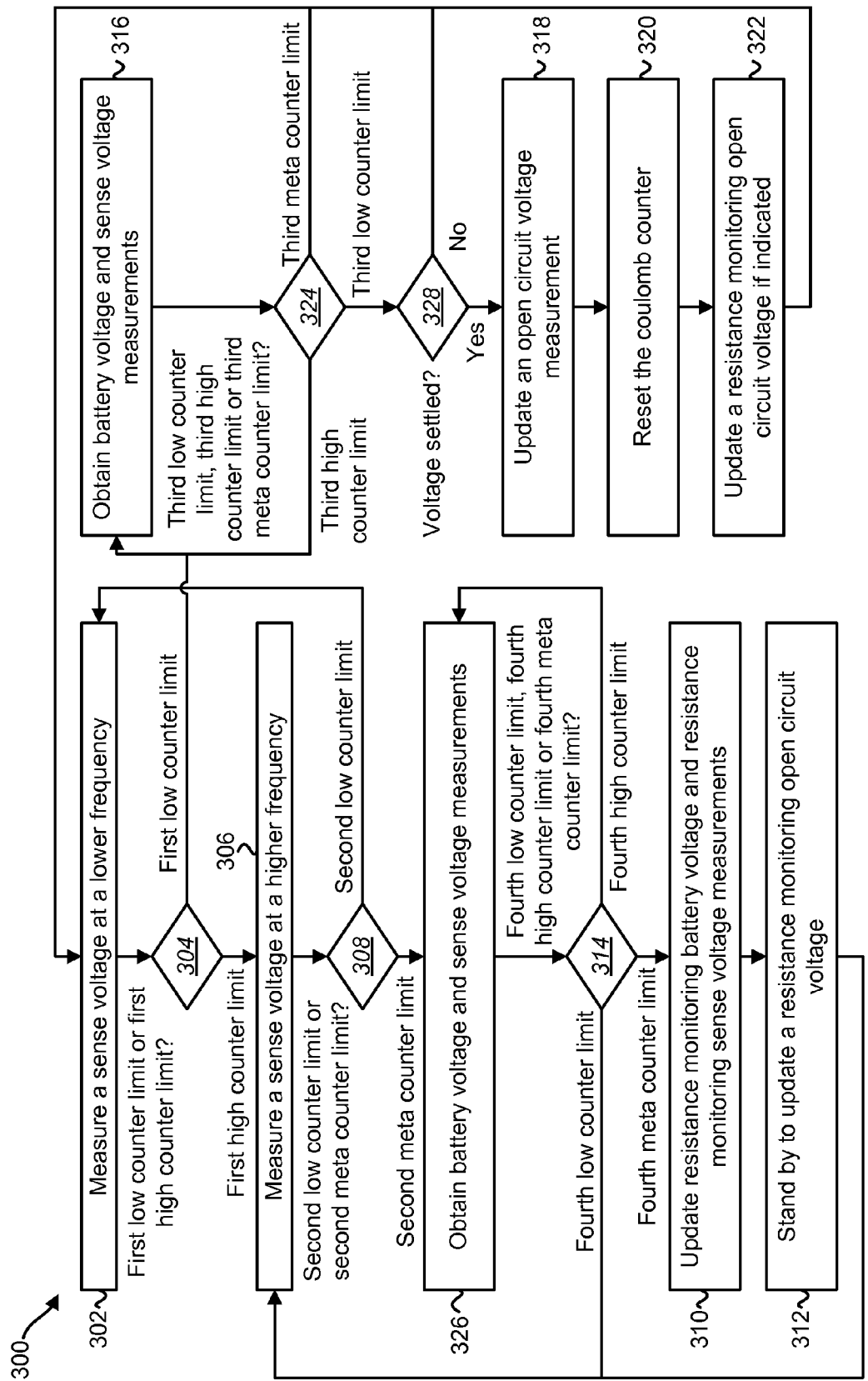
FIG. 3 is a flow diagram illustrating one configuration of a method for monitoring a battery.

FIG. 3 is a flow diagram illustrating one configuration of a method 300 for monitoring a battery 104. The battery monitoring circuit 102 may measure 302 a sense voltage 140 at a lower frequency (e.g., according to a low duty cycle). For example, the battery monitoring circuit 102 may measure 302 the sense voltage 140 less often in a low-load state 241 than when in a high-load state 235. This may reduce monitoring power consumption by decreasing measurement frequency during device standby or other low-load modes, for instance. In one configuration, the battery monitoring circuit 102 may measure 302 the sense voltage 140 at a lower frequency by indicating a low-load state 241 to a multiplexer 105. The multiplexer 105 may pass selected settings information 107 corresponding to the low-load state 241 to a controller 109, which may control one or more elements of the battery monitoring circuit 102 to operate at a lower frequency.

The battery monitoring circuit 102 may determine 304 whether a first low counter limit or a first high counter limit has been reached. For example, when the low counter 178 reaches a first low counter limit, it 178 may provide a low counter overflow signal 184 indicating that the first low counter limit has been reached. Additionally or alternatively, when the high counter 176 reaches a first high counter limit, it 176 may provide a high counter overflow signal 182 indicating that the first high counter limit has been reached.

If the first high counter limit has been reached, the battery monitoring circuit 102 may measure 306 a sense voltage 140 at a higher frequency. For example, the battery monitoring circuit 102 may measure 306 the sense voltage 140 more often in a high-load state 235 than when in a low-load state 241. This may increase measurement accuracy with more frequent measurements during active device use. In one configuration, the battery monitoring circuit 102 may measure 306 the sense voltage 140 at a higher frequency by indicating a high-load state 235 to a multiplexer 105. The multiplexer 105 may pass selected settings information 107 corresponding to the high-load state 235 to the controller 109, which may control one or more elements of the battery monitoring circuit 102 to operate at a higher frequency.

The battery monitoring circuit 102 may determine 308 whether a second low counter limit or a second meta counter limit has been reached. For example, when the low counter 178 reaches a second low counter limit, it 178 may provide a low counter overflow signal 184 indicating that the second low counter limit has been reached. In one configuration, a moderate limit on the low counter 178 in the high-load state 235 may reduce a chance of an incorrect drop to the low-load state 241. Additionally or alternatively, when the meta counter 186 reaches a second meta counter limit, it 186 may provide a meta counter overflow signal 188 indicating that the second meta counter limit has been reached.

If the second low counter limit has been reached, the battery monitoring circuit 102 may return to measuring 302 a sense voltage 140 at a higher frequency. If the second meta counter limit has been reached, the battery monitoring circuit 102 may obtain 326 a battery voltage measurement 138 and a sense voltage measurement 140. For example, simultaneous battery voltage 138 and sense voltage 140 measurements may be taken.

The battery monitoring circuit 102 may determine 314 whether a fourth low counter limit, a fourth high counter limit or a fourth meta counter limit has been reached. For example, when the low counter 178 reaches a fourth low counter limit, it 178 may provide a low counter overflow signal 184 indicating that the fourth low counter limit has been reached. Additionally or alternatively, when the high counter 176 reaches a fourth high counter limit, it 176 may provide a high counter overflow signal 182 indicating that the fourth high counter limit has been reached. Additionally or alternatively, when the meta counter 186 reaches a fourth meta counter limit, it 186 may provide a meta counter overflow signal 188 indicating that the fourth meta counter limit has been reached.

It should be noted that a meta counter overflow signal 188 may take precedence over a high counter overflow signal 182. For example, assume that the high counter 176 has provided an overflow signal 182 to the meta counter 186 that causes the meta counter 186 to reach its limit or threshold, thus causing the meta counter 186 to provide a meta counter overflow signal 188. In this scenario, the state machine 190 may receive both a high counter overflow signal 182 and a meta counter overflow signal 188. In this case, the state machine 190 may determine a state transition based first on the meta counter overflow signal 188. Thus, the high counter overflow signal 182 may be disregarded in some cases.

If the fourth low counter limit has been reached, the battery monitoring circuit 102 may return to measuring 306 a sense voltage 140 at a higher frequency. In one configuration, the fourth low counter limit may be equal to one. If the fourth high counter limit has been reached, the battery monitoring circuit 102 may return to obtaining 326 battery voltage 138 and sense voltage 140 measurements. In one configuration, the fourth high counter limit may be equal to one.

If the fourth meta counter limit has been reached, the battery monitoring circuit 102 may update 310 a resistance monitoring battery voltage and a resistance monitoring sense voltage measurement. More specifically, the battery monitoring circuit 102 may update 310 a resistance monitoring battery voltage. For example, the resistance monitoring block/module 150 may provide an updated resistance monitoring battery voltage to the output registers 158. Furthermore, the battery monitoring circuit may update 310 a resistance monitoring sense voltage. For example, the resistance monitoring block/module 150 may provide an updated resistance monitoring sense voltage to the output registers 158.

The battery monitoring circuit 102 may also stand by 312 to update a resistance monitoring open circuit voltage. For example, the resistance monitoring block/module 150 may set a flag to update the resistance monitoring open circuit voltage under certain conditions. For instance, the resistance monitoring open circuit voltage may possibly be updated when the battery monitoring circuit 102 or state machine 190 enters an open circuit voltage measurement state 247 (if the battery voltage 138 is settled, for example). The battery monitoring circuit 102 may return to measure 306 a sense voltage 104 at a higher frequency.

If it is determined 304 that the first low counter limit is reached, the battery monitoring circuit 102 may obtain 316 a battery voltage measurement 138 and a sense voltage measurement 140. For example, simultaneous battery voltage 138 and sense voltage 140 measurements may be taken.

The battery monitoring circuit 102 may determine 324 whether a third low counter limit, a third high counter limit or a third meta counter limit has been reached. For example, when the low counter 178 reaches a third low counter limit, it 178 may provide a low counter overflow signal 184 indicating that the third low counter limit has been reached. Additionally or alternatively, when the high counter 176 reaches a third high counter limit, it 176 may provide a high counter overflow signal 182 indicating that the third high counter limit has been reached. Additionally or alternatively, when the meta counter 186 reaches a third meta counter limit, it 186 may provide a meta counter overflow signal 188 indicating that the third meta counter limit has been reached.

If the third meta counter limit is reached, the battery monitoring circuit 102 may return to measuring 302 a sense voltage 140 at a lower frequency. If the third high counter limit is reached, the battery monitoring circuit 102 may return to obtaining 316 a battery voltage measurement 138 and a sense voltage measurement 140. In one configuration, the third high counter limit may be equal to one. In this case, the open circuit voltage measurement may have occurred during a current spike (e.g., modem current spike), so the open circuit voltage measurement may be retried.

If the third low counter limit is reached, the battery monitoring circuit 102 may determine 328 whether a voltage (e.g., battery voltage and/or open circuit voltage) has settled. For example, the voltage may be settled if a new open circuit voltage is less than the previous open circuit voltage (plus a tolerance). In one configuration, an "open circuit voltage settled" flag may be set to automatically accept further open circuit voltage measurements during device standby. If the voltage has not settled, the battery monitoring circuit 102 may return to measuring 302 a sense voltage 140 at a lower frequency.

If the voltage has settled, the battery monitoring circuit 102 may update 318 an open circuit voltage measurement 152. For example, the battery monitoring circuit 102 may provide an updated open circuit voltage measurement 152 to the output registers 158 if the voltage has settled.

The battery monitoring circuit 102 may reset 320 the coulomb counter 142. For example, the coulomb counter 142 may be reset to zero if the voltage is settled. In one configuration, the open circuit voltage monitoring block/module 146 may send information 121 to the controller 109 indicating that the coulomb counter 142 should be reset. The controller 109 may use this information 121 to send a reset signal 119 to the coulomb counter 142.

The battery monitoring circuit 102 may update 322 a resistance monitoring open circuit voltage if indicated. In some configurations, updating 322 the resistance monitoring open circuit voltage may be indicated if and only if a previous resistance monitoring battery voltage and resistance monitoring sense voltage were taken (e.g., updated 310) and it is the first time the procedure after determining 328 settled voltage (e.g., updating 318 an open circuit voltage measurement and/or resetting 320 the coulomb counter) has been performed since entering the low-load state (e.g., measuring 302 a sense voltage 140 at a lower frequency). In one configuration, the open circuit voltage monitoring block/module 146 may provide an updated open circuit voltage measurement 152 to the output registers 158 if a flag has been set to update 322 the resistance monitoring open circuit voltage. The flag may have been set if a new resistance monitoring voltage and a new resistance monitoring sense voltage have been updated 310.

Figure 4:
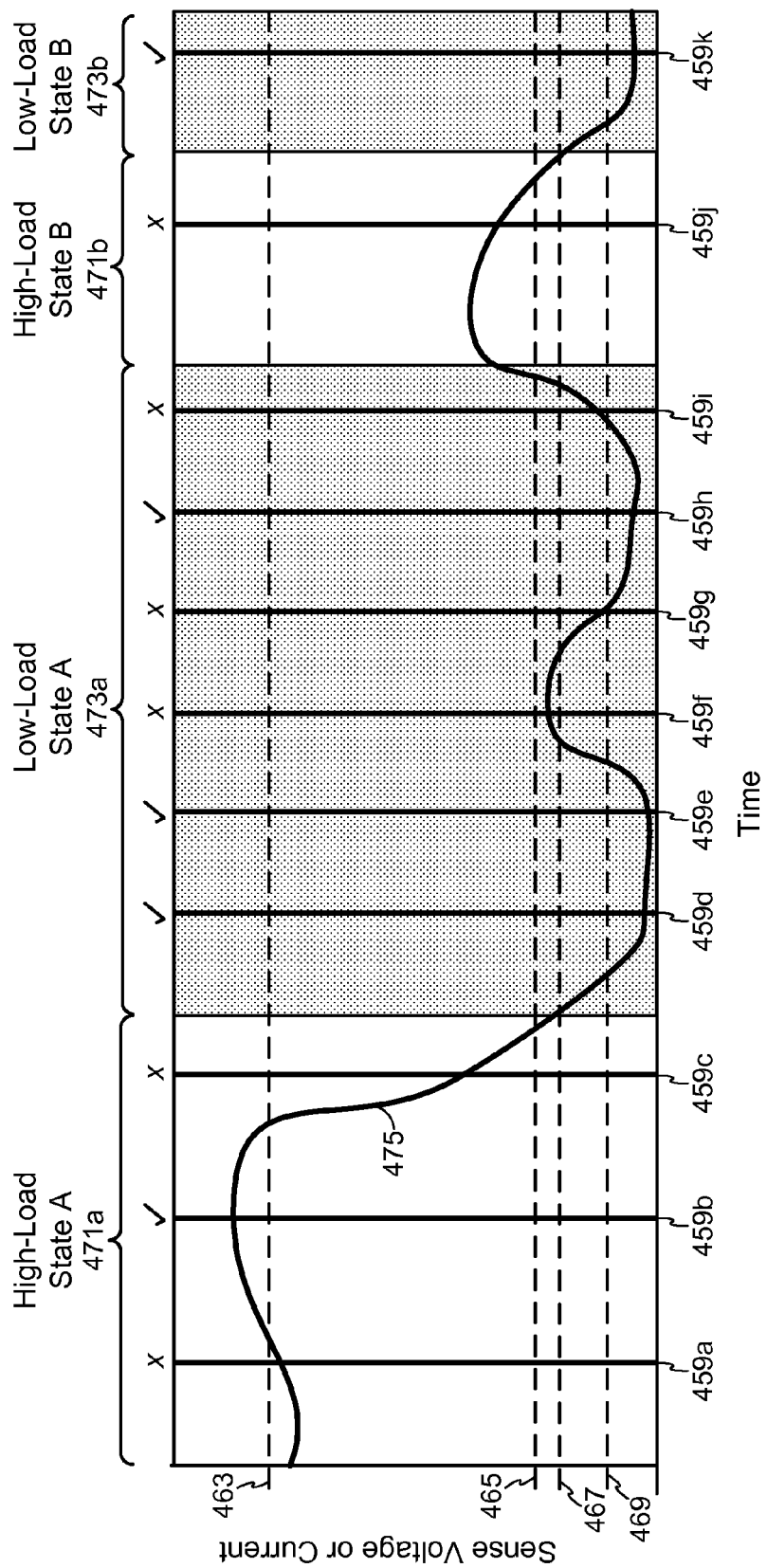
FIG. 4 is a graph illustrating one example of the functioning of the battery monitoring circuit.

FIG. 4 is a graph illustrating one example of the functioning of the battery monitoring circuit 102. The horizontal axis of the graph illustrates time, while the vertical axis of the graph illustrates a sense voltage or battery current. Four thresholds are illustrated on the vertical axis: a resistance measuring or monitoring threshold 463, a low-load threshold 465, a high-load threshold 467 and an open circuit voltage measuring threshold 469. As illustrated, the state of the battery monitoring circuit 102 (e.g., state machine 190) may change based on a sense voltage 475 (e.g., battery current). Several measurement points 459a-k are illustrated along the horizontal axis. It should be noted that the example illustrated in FIG. 4 may not have a consistent scale. For example, the measurement points 459d-i while in low-load state A 473a may actually occur less frequently than the measurement points 459a-c while in high-load state A 471a.

In this example, the battery monitoring circuit 102 operates in high-load state A 471a, then transitions to low-load state A 473a, then transitions to high-load state B 471b and then transitions to low-load state B 473b. While in high-load state A 471a, three measurement points 459a-c occur. However, resistance monitoring measurements and resistance monitoring sense voltage measurements may only be updated during the second measurement point 459b, when the battery monitoring circuit 102 is above the resistance monitoring threshold 463 (e.g., when in the auxiliary resistance measurement state 253).

As illustrated in FIG. 4, the sense voltage 475 (e.g., battery current) drops after the second measurement point 459b to the point that the battery monitoring circuit 102 transitions to low-load state A 473a. This transition may be triggered by the sense voltage 475 (e.g., battery current) dropping below the low-load threshold 465 (e.g., counting to a second low counter limit). While in low-load state A 473a, the battery monitoring circuit 102 only updates the open circuit voltage measurement(s) (e.g., open circuit voltage measurement and/or resistance monitoring open circuit voltage measurement) at the fourth measurement point 459d, the fifth measurement point 459e and the eighth measurement point 459h. This may occur when the voltage is sufficiently settled to obtain a more accurate voltage reading. As illustrated, this may occur when the sense voltage 475 (e.g., battery current) is below the open circuit voltage measuring threshold 469 (e.g., when the battery monitoring circuit 102 is in the auxiliary open circuit voltage measurement state 247, but not during a current spike). In other words, this may occur when the first low counter limit is reached.

As illustrated, the sense voltage 475 (e.g., battery current) increases after the eighth measurement point 459h to the point that the battery monitoring circuit 102 enters high-load state B 471b. This transition may be triggered by the sense voltage 475 (e.g., battery current) increasing above the high-load threshold 467 (e.g., counting to a first high counter limit). In high-load state B 471b, the sense voltage 475 (e.g., battery current) does not increase enough to take a measurement at the tenth measurement point 459j, but drops to the point that the battery monitoring circuit 102 enters low-load state B 473b. While in low-load state B 473b, the sense voltage 475 (e.g., battery current) drops enough to take open circuit voltage measurement(s) at the eleventh measurement point 459k.

Figure 5:
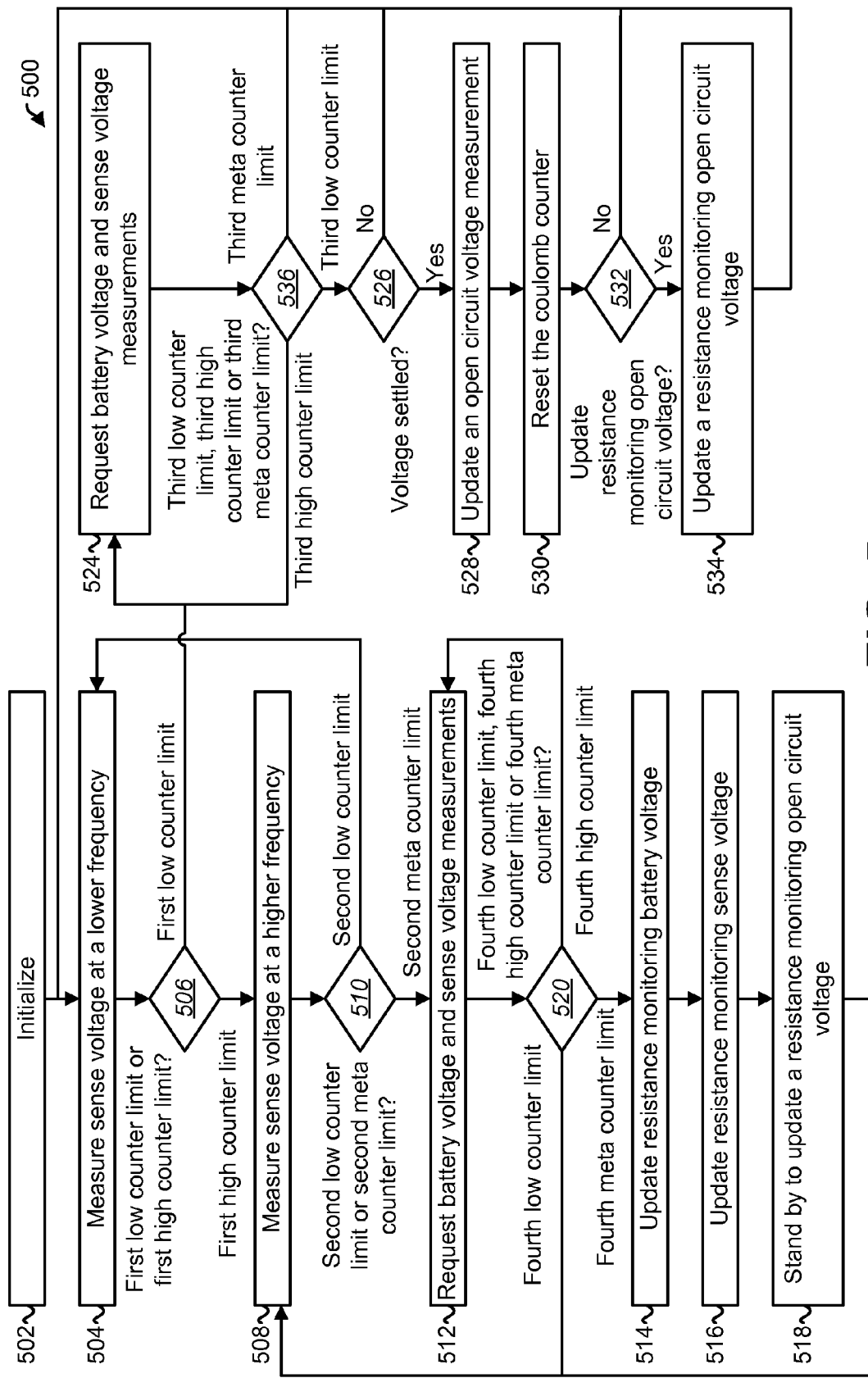
FIG. 5 is a flow diagram illustrating another configuration of a method for monitoring a battery.

FIG. 5 is a flow diagram illustrating another configuration of a method 500 for monitoring a battery 104. The battery monitoring circuit 102 may initialize 502. For example, when a device is initially powered on, the battery monitoring circuit 102 may initialize 502 by obtaining an open circuit voltage measurement.

The battery monitoring circuit 102 may measure 504 a sense voltage 140 at a lower frequency (e.g., according to a low duty cycle). For example, the battery monitoring circuit 102 may measure 504 the sense voltage 140 less often in a low-load state 241 than when in a high-load state 235. This may reduce monitoring power consumption by decreasing measurement frequency during device standby, for instance. In one configuration, the battery monitoring circuit 102 may measure 504 the sense voltage 140 at a lower frequency by indicating a low-load state 241 to a multiplexer 105. The multiplexer 105 may pass selected settings information 107 corresponding to the low-load state 241 to a controller 109, which may control one or more elements of the battery monitoring circuit 102 to operate at a lower frequency.

The battery monitoring circuit 102 may determine 506 whether a first low counter limit or a first high counter limit has been reached. For example, when the low counter 178 reaches a first low counter limit, it 178 may provide a low counter overflow signal 184 indicating that the first low counter limit has been reached. Additionally or alternatively, when the high counter 176 reaches a first high counter limit, it 176 may provide a high counter overflow signal 182 indicating that the first high counter limit has been reached.

If the first high counter limit has been reached, the battery monitoring circuit 102 may measure 508 a sense voltage 140 at a higher frequency. For example, the battery monitoring circuit 102 may measure 508 the sense voltage 140 more often in a high-load state 235 than when in a low-load state 241. This may increase measurement accuracy with more frequent measurements during active device use. In one configuration, the battery monitoring circuit 102 may measure 508 the sense voltage 140 at a higher frequency by indicating a high-load state 235 to a multiplexer 105. The multiplexer 105 may pass selected settings information 107 corresponding to the high-load state 235 to the controller 109, which may control one or more elements of the battery monitoring circuit 102 to operate at a higher frequency.

The battery monitoring circuit 102 may determine 510 whether a second low counter limit or a second meta counter limit has been reached. For example, when the low counter 178 reaches a second low counter limit, it 178 may provide a low counter overflow signal 184 indicating that the second low counter limit has been reached. In one configuration, a moderate limit on the low counter 178 in the high-load state 235 may reduce a chance of an incorrect drop to the low-load state 241. Additionally or alternatively, when the meta counter 186 reaches a second meta counter limit, it 186 may provide a meta counter overflow signal 188 indicating that the second meta counter limit has been reached.

If the second low counter limit has been reached, the battery monitoring circuit 102 may return to measuring 504 a sense voltage 140 at a higher frequency. If the second meta counter limit has been reached, the battery monitoring circuit 102 may request 512 a battery voltage measurement 138 and a sense voltage measurement 140. For example, simultaneous battery voltage 138 and sense voltage 140 measurements may be taken.

The battery monitoring circuit 102 may determine 520 whether a fourth low counter limit, a fourth high counter limit or a fourth meta counter limit has been reached. For example, when the low counter 178 reaches a fourth low counter limit, it 178 may provide a low counter overflow signal 184 indicating that the fourth low counter limit has been reached. Additionally or alternatively, when the high counter 176 reaches a fourth high counter limit, it 176 may provide a high counter overflow signal 182 indicating that the fourth high counter limit has been reached. Additionally or alternatively, when the meta counter 186 reaches a fourth meta counter limit, it 186 may provide a meta counter overflow signal 188 indicating that the fourth meta counter limit has been reached. As described above, the meta counter 186 may increment when the high counter 176 reaches a limit or threshold.

It should be noted that a meta counter overflow signal 188 may take precedence over a high counter overflow signal 182. For example, assume that the high counter 176 has provided an overflow signal 182 to the meta counter 186 that causes the meta counter 186 to reach its limit or threshold, thus causing the meta counter 186 to provide a meta counter overflow signal 188. In this scenario, the state machine 190 may receive both a high counter overflow signal 182 and a meta counter overflow signal 188. In this case, the state machine 190 may determine a state transition based first on the meta counter overflow signal 188. Thus, the high counter overflow signal 182 may be disregarded in some cases.

If the fourth low counter limit has been reached, the battery monitoring circuit 102 may return to measuring 508 a sense voltage 140 at a higher frequency. In one configuration, the fourth low counter limit may be equal to one. If the fourth high counter limit has been reached, the battery monitoring circuit 102 may return to requesting 512 a battery voltage measurement 138 and a sense voltage measurement 140. In one configuration, the fourth high counter limit may be equal to one.

If the fourth meta counter limit has been reached, the battery monitoring circuit 102 may update 514 a resistance monitoring battery voltage. For example, the resistance monitoring block/module 150 may provide an updated resistance monitoring voltage to the output registers 158. The battery monitoring circuit may update 516 a resistance monitoring sense voltage. For example, the resistance monitoring block/module 150 may provide an updated resistance monitoring sense voltage to the output registers 158. The battery monitoring circuit 102 may also stand by 518 to update a resistance monitoring open circuit voltage. For example, the resistance monitoring block/module 150 may set a flag to update the resistance monitoring open circuit voltage under certain conditions. For instance, the resistance monitoring open circuit voltage may possibly be updated when the battery monitoring circuit 102 or state machine 190 enters an open circuit voltage measurement state 247 (if the battery voltage 138 is settled, for example). In some configurations, updating 514 (and storing, for example) a resistance monitoring battery voltage and updating 516 (and storing, for example) a resistance monitoring sense voltage may be triggered by signaling the resistance monitoring block/module 150. For example, the battery monitoring circuit 102 may signal the resistance monitoring block/module 150 to trigger the respective update 514, 516 and storage of the resistance monitoring battery voltage and the resistance monitoring sense voltage (e.g., current). The battery monitoring circuit 102 may then return to measuring 508 a sense voltage 140 at a higher frequency.

If it is determined 506 that the first low counter limit is reached, the battery monitoring circuit 102 may request 524 a battery voltage measurement 138 and a sense voltage measurement 140. For example, simultaneous battery voltage 138 and sense voltage 140 measurements may be taken.

The battery monitoring circuit 102 may determine 536 whether a third low counter limit, a third high counter limit or a third meta counter limit has been reached. For example, when the low counter 178 reaches a third low counter limit, it 178 may provide a low counter overflow signal 184 indicating that the third low counter limit has been reached. Additionally or alternatively, when the high counter 176 reaches a third high counter limit, it 176 may provide a high counter overflow signal 182 indicating that the third high counter limit has been reached. Additionally or alternatively, when the meta counter 186 reaches a third meta counter limit, it 186 may provide a meta counter overflow signal 188 indicating that the third meta counter limit has been reached.

If the third meta counter limit is reached, the battery monitoring circuit 102 may return to measuring 504 a sense voltage 140 at a lower frequency. If the third high counter limit is reached, the battery monitoring circuit 102 may return to requesting 524 a battery voltage measurement 138 and a sense voltage measurement 140. In one configuration, the third high counter limit may be equal to one. In this case, the open circuit voltage measurement may have occurred during a current spike (e.g., modem current spike), so the open circuit voltage measurement may be retried.

If the third low counter limit has been reached, the battery monitoring circuit 102 may determine 526 whether a voltage has settled. For example, a new open circuit voltage may be compared to a previous open circuit voltage to determine the slope of the battery voltage. If the new open circuit voltage is less than the previous open circuit voltage (plus a tolerance), the battery monitoring circuit 102 may determine 526 that the voltage has settled. If the battery monitoring circuit 102 determines 526 that the voltage has not settled, the battery monitoring circuit 102 may return to measuring 504 a sense voltage 140 at a lower frequency.

If the battery monitoring circuit 102 determines 526 that the voltage has settled, then the battery monitoring circuit 102 may update 528 an open circuit voltage measurement 152. For example, the battery monitoring circuit 102 may provide an updated open circuit voltage measurement 152 to the output registers 158. In one configuration, an "open circuit voltage settled" flag may be set to automatically accept further open circuit voltage measurements during device standby.

The battery monitoring circuit 102 may reset 530 the coulomb counter 142. For example, the coulomb counter 142 may be reset to zero. In one configuration, the open circuit voltage monitoring block/module 146 may send information 121 to the controller 109 indicating that the coulomb counter 142 should be reset. The controller 109 may use this information 121 to send a reset signal 119 to the coulomb counter 142.

The battery monitoring circuit 102 may determine 532 whether to update a resistance monitoring open circuit voltage. In one configuration, this determination 532 may be based on whether a previous resistance monitoring battery voltage and resistance monitoring sense voltage were taken (e.g., updated 514, 516) and it is the first time the procedure after determining 526 settled voltage (e.g., updating 528 an open circuit voltage measurement and/or resetting 530 the coulomb counter) has been performed since entering the low-load state (e.g., measuring 504 a sense voltage 140 at a lower frequency). For instance, the battery monitoring circuit 102 may have set a flag indicating an updated 514 resistance monitoring battery voltage and an updated 516 resistance monitoring sense voltage.

If the battery monitoring circuit 102 determines 532 not to update the resistance monitoring open circuit voltage, the battery monitoring circuit 102 may return to measuring 504 a sense voltage 140 at a lower frequency. If the battery monitoring circuit 102 determines 532 to update the resistance monitoring open circuit voltage, then the battery monitoring circuit 102 may update 534 the resistance monitoring open circuit voltage. For example, the open circuit voltage monitoring block/module 146 may provide an updated open circuit voltage measurement 152 to the output registers 158. The battery monitoring circuit 102 may return to measuring 504 a sense voltage 140 at a lower frequency.

It should be noted that updating 528 an open circuit voltage measurement (e.g., a "good" open circuit voltage) may be triggered by signaling the open circuit voltage monitoring block/module 146. This signaling may also potentially trigger updating 534 a resistance monitoring open circuit voltage.

Figure 6:
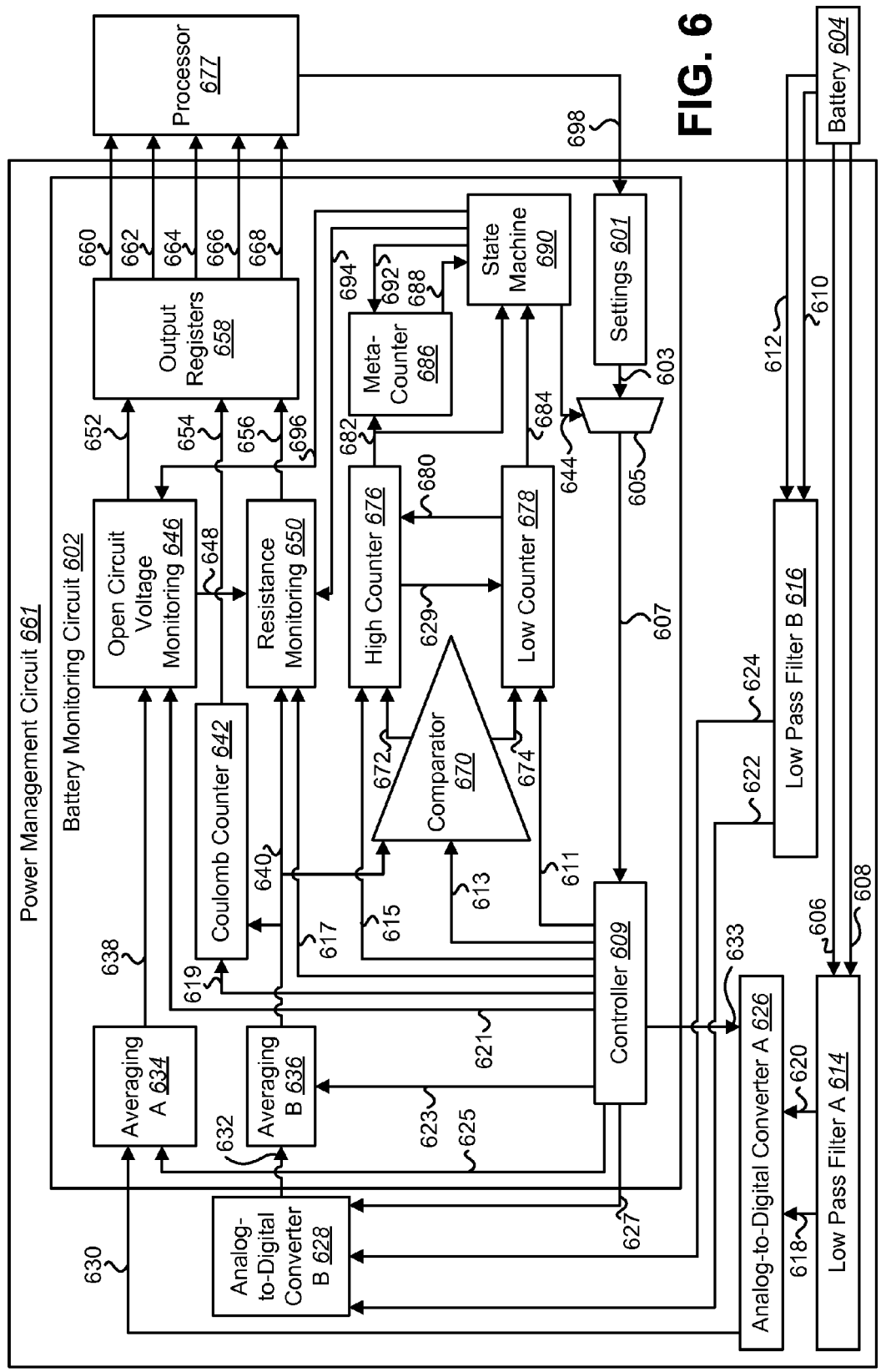
FIG. 6 is a block diagram illustrating one configuration of a power management circuit.

FIG. 6 is a block diagram illustrating one configuration of a power management circuit 661. The power management circuit 661 (e.g., power management integrated circuit or PMIC) may include a battery monitoring circuit 602, analog-to-digital converter A 626, analog-to-digital converter B 628, low-pass filter A 614 and low-pass filter B 616. The power management circuit 661 may be coupled to a battery 604 and/or to a processor 677.

The battery monitoring circuit 602 may include averaging block/module A 634, averaging block/module B 636, a coulomb counter 642, an open circuit voltage monitoring block/module 646, a resistance monitoring block/module 650, a comparator 670, a high counter 676, a low counter 678, a meta counter 686, a state machine 690, output registers 658, a controller 609, a multiplexer 605 and/or a settings block/module 601. In one configuration, the battery monitoring circuit 602 may be coupled to analog-to-digital converter A 626, analog-to-digital converter B 628, low pass filter A 614, low pass filter B 616 and/or a battery 604. In another configuration, the battery monitoring circuit 102 may include analog-to-digital converter B 628.

The battery 604 may be an energy source that is monitored by the battery monitoring circuit 602. Examples of the battery 604 include alkaline batteries, lithium batteries, lithium-ion batteries, polymer-based battery and others. The battery 604 may also include or be coupled to circuitry (e.g., a sense resistor) used to measure a voltage. A battery voltage may be measured between the terminals of the battery 604. For example, a positive terminal 606 and a negative terminal 608 of the battery may be coupled to low pass filter A 614. Low pass filter A 614 may be coupled to analog-to-digital converter A 626. In some configurations, analog-to-digital converter A 626 may be an analog-to-digital converter that is used for other functions not performed by the battery monitoring circuit 602. For example, analog-to-digital converter A 626 may be used to measure a crystal oscillator and for other functions.

Low pass filter A 614 may provide a filtered positive signal 620 and a filtered negative signal 618 to analog-to-digital converter A 626. Analog-to-digital converter A 626 may be coupled to averaging block/module A 634. Analog-to-digital converter A 626 may convert the positive signal 620 and negative signal 618 into a digital battery voltage 630 (e.g., a quantized battery voltage measurement) that is provided to averaging block/module A 634.

The battery 604 may be coupled to low pass filter B 616. An analog sense voltage 610 and a ground terminal 612 may be provided from the battery 604. For example, the battery 604 may be coupled to a sense resistor that is coupled to a ground terminal 612. The sense voltage 610 may be a voltage taken from between a terminal of the battery 604 and the sense resistor. Thus, the sense voltage 610 and ground terminal 612 may provide a sense voltage 610 that is measured over the sense resistor. The sense voltage 610 and the ground terminal 612 may be provided to low pass filter B 616. Low pass filter B 616 may be coupled to analog-to-digital converter B 628. Low pass filter B 616 may provide a filtered sense voltage 622 and filtered ground 624 to analog-to-digital converter B 628. Analog-to-digital converter B 628 may convert the filtered sense voltage 622 and the filtered ground 624 into a digital sense voltage 632 (e.g., a quantized sense voltage measurement) that is provided to averaging block/module B 636.

Averaging block/module A 634 may be coupled to an open circuit voltage monitoring block/module 646. Averaging block/module A 634 may average a number of digital voltage 630 samples to provide a voltage 638 (e.g., an averaged voltage) measurement to the open circuit voltage monitoring block/module 646.

Averaging block/module B 636 may be coupled to a resistance monitoring block/module 650, to a coulomb counter 642 and/or to a comparator 670. Averaging block/module B 636 may average a number of digital sense voltage 632 samples to provide a sense voltage 640 (e.g., an averaged sense voltage) measurement to the resistance monitoring block/module 650. It should be noted that the sense voltage 640 may also be referred to as a battery current. This is because the sense voltage 640 may be used to derive a battery current based on the resistance of the sense resistor.

The coulomb counter 642 may be coupled to the output registers 658. The coulomb counter 642 may be used to measure consumed charge. For example, the coulomb counter 642 may measure a consumed charge based on the sense voltage 640 (e.g., battery current). The coulomb counter 642 may provide a consumed charge measurement 654 to the output registers.

More detail on some possible configurations of the coulomb counter 642 is given hereafter. Although current waveforms in portable equipment are complex, only the integral of the current waveform may be of interest. Waveform reconstruction may be unnecessary. Therefore, all frequency information may be discarded as long as an accurate count of the net charge in maintained. A coulomb counting analog-to-digital converter may be implemented using a voltage frequency converter (VFC) or a sigma delta analog-to-digital converter. A voltage frequency converter is a current integrator that integrates current in and out of a battery. It converts the current information into pulses. The frequency of the pulses may be proportional to the total current integrated. Alternatively, a sampling system such as a sigma delta analog-to-digital converter may achieve the same goal with better accuracy as long as certain criteria can be met.

The comparator 670 may be coupled to the high counter 676 and to the low counter 678. The comparator 670 may compare the sense voltage 640 (e.g., battery 604 current) to a threshold 613. When the sense voltage 640 or battery current is higher than or above the threshold 613, the comparator 670 may provide a high increment signal 672 to the high counter 676 that causes the high counter 676 to increment. When the sense voltage 640 or battery current is lower than or below the threshold 613, the comparator 670 may provide a low increment signal 674 to the low counter 678 that causes the low counter 678 to increment. In one configuration, the high counter 676 and the low counter 678 are register counters.

The low counter 678 may be coupled to the high counter 676 and to the state machine 690. The low counter 678 may use a set of limits or thresholds based on the state of the state machine 690. For example, the low counter 678 may use a limit or threshold for each state. When the low counter 678 is incremented to its (current state) limit (e.g., when the low counter's 678 count is equal to its limit), the low counter 678 may provide a low counter "overflow" signal 684 to the state machine 690. When this occurs, the low counter 678 may reset and the low counter 678 may also provide a reset signal 680 to the high counter 676 that causes the high counter 676 to reset (to zero).

The high counter 676 may be coupled to the low counter 678, to the meta counter 686 and/or to the state machine 690.

The high counter 676 may use a set of limits or thresholds based on the state of the state machine 690. For example, the high counter 676 may use a limit or threshold for each state. When the high counter 676 is incremented to its (current state) limit (e.g., when the high counter's 676 count is equal to its limit), the high counter 676 may provide a high counter "overflow" signal 682 to the state machine 690 and/or to the meta counter 686. When this occurs, the high counter 676 may reset and may also provide a reset signal 629 to the low counter 678 that causes the low counter 678 to reset (to zero).

The meta counter 686 may be coupled to the state machine 690. The meta counter 686 may be incremented based on the overflow signal 682 from the high counter 676. For example, when the high counter 676 provides the overflow signal 682, the meta counter 686 is incremented. The meta counter 686 may use a set of limits or thresholds based on the state of the state machine 690. For example, the meta counter 686 may use a limit or threshold for one or more states. When the meta counter 686 is incremented to its (current state) limit (e.g., when the meta counter's 686 count is equal to its limit), the meta counter 686 may provide a meta counter "overflow" signal 688 to the state machine 690. When this occurs, the meta counter 686 may reset (to zero).

The state machine 690 may be coupled to the meta counter 686, to the open circuit voltage monitoring block/module 646, to the resistance monitoring block/module 650 and/or to the multiplexer 605. One example of the state machine 690 is a finite state machine (FSM). The state machine 690 may determine a state based on the low counter overflow signal 684, the high counter overflow signal 682 and/or the meta counter overflow signal 688. In some configurations, the state machine 690 may provide a present state signal 644 to the multiplexer 605. Additionally or alternatively, the state machine 690 may provide a resistance monitoring control signal 694 to the resistance monitoring block/module 650 and/or may provide an open circuit voltage monitoring control signal 696 to the open circuit voltage monitoring block/module 646. The state machine 690 may provide a meta counter reset signal 692 to reset the meta counter 686 at one or more state transitions. Additionally or alternatively, the state machine 690 may provide the meta counter reset signal 692 to reset the meta counter when a high counter overflow signal 682, a low counter overflow signal 684 and/or a meta counter overflow signal 688 is received.

The open circuit voltage monitoring block/module 646 may be coupled to the output registers 658 and to the resistance monitoring block/module 650. The open circuit voltage monitoring block/module 646 may be used to measure a battery voltage 638. For example, the open circuit voltage monitoring block/module 646 may provide an open circuit voltage measurement 652 to the output registers 658. Additionally or alternatively, the open circuit voltage monitoring block/module 646 may provide voltage measurements 648 to the resistance monitoring block/module 650. The voltage measurements 648 may include a resistance monitoring open circuit voltage measurement and/or a voltage (for resistance monitoring).

The open circuit voltage monitoring block/module 646 may determine whether the voltage 638 is settled. In one configuration, the battery voltage 638 may be sampled at a low delay, but its validity may be tested before updating the coulomb counter 642. For example, the delay may be set to approximately half of battery 604 settling time. During a first open circuit voltage update after load, an initial open circuit voltage may be measured by the open circuit voltage monitoring block/module 646, with the result stored internally. At subsequent open circuit voltage updates, the new open circuit voltage may be compared to a previous open circuit voltage to determine the slope of the battery voltage 638. If the current open circuit voltage is less than the previous open circuit voltage (plus a tolerance), the coulomb counter 642 may be reset and the new open circuit voltage may be used to provide an updated open circuit voltage measurement 652 to the output registers 658. In this case, an "open circuit voltage settled" flag may be set to automatically accept further open circuit voltage measurements during standby.

The resistance monitoring block/module 650 may be coupled to the output registers 658. The resistance monitoring block/module 650 may provide measurements 656 to the output registers 658. The measurements 656 may include a resistance monitoring open circuit voltage, a resistance monitoring voltage and/or a resistance monitoring sense voltage. The resistance monitoring block/module 650 may receive a resistance monitoring open circuit voltage measurement and/or a voltage (for resistance monitoring) from the open circuit voltage monitoring block/module 646. For example, the resistance monitoring block/module 650 may provide the resistance monitoring open circuit voltage to the output registers 658 based on the resistance monitoring open circuit voltage measurement received from the open circuit voltage monitoring block/module 646. Furthermore, the resistance monitoring block/module 650 may provide the resistance monitoring voltage to the output registers 658 based on the voltage (for resistance monitoring) received from the open circuit voltage monitoring block/module 646. The resistance monitoring block/module 650 may additionally or alternatively provide a resistance monitoring sense voltage to the output registers 658 based on the sense voltage 640.

The output registers 658 may store and/or output measurement data. In one configuration, the output registers 658 may provide the output data to a processor for further calculations. The output registers 658 may receive and store an open circuit voltage measurement 652, a consumed charge measurement 654 and/or measurements 656 (including a resistance monitoring open circuit voltage, a resistance monitoring voltage and/or a resistance monitoring sense voltage, for example). The output registers 658 may thus provide open circuit voltage data 660, consumed charge data 662, resistance monitoring open circuit voltage data 664, resistance monitoring voltage data 666 and/or resistance monitoring sense voltage data 668 to another block/module (e.g., a processor 677).

In one configuration, the state machine 690 may use two main states and two auxiliary states. The two main states may include a high-load state and a low-load state. The auxiliary states may include a resistance measurement state and an open circuit voltage measurement state. Analog-to-digital converter A 626 may only be used by the battery monitoring circuit 602 during auxiliary states. In one configuration, analog-to-digital converter A 626 may typically be used for a crystal oscillator.

The low-load state may use lower frequency (e.g., low-duty-cycle) current (e.g., sense voltage 640) monitoring. For example, the low-load state may reduce monitoring power consumption by decreasing measurement frequency during device (e.g., cell phone) standby. The state machine 690 (e.g., FSM) may transition from the low-load state to the high-load state if the high counter 676 reaches a first high counter limit or threshold. A small limit or threshold on the high counter 676 in the low-load state may allow for a quick response to an active load. The state machine 690 (e.g., FSM) may transition from the low-load state to the open circuit voltage measurement state if a low counter 678 reaches a first low counter limit or threshold. A large limit or threshold on the low counter 678 in this state may set a delay before an open circuit voltage update is (first) attempted.

The high-load state may increase accuracy with more frequent current (e.g., voltage over a sense resistor) measurements. For example, the high-load state may increase accuracy with more frequent measurements during active device (e.g., cellular phone) use. The state machine 690 (e.g., FSM) may transition from the high-load state to the low-load state if the low counter 678 reaches a second low counter limit or threshold. A moderate threshold on the low counter 678 in this state may reduce a chance of an incorrect drop to standby. The state machine 690 (e.g., FSM) may transition from the high-load state to the resistance measurement state if the meta counter 686 reaches a second meta counter limit or threshold. An extended period of a high load may be better for resistance measurement data collection.

While in the resistance measurement state, several operations may be performed. Simultaneous voltage 638 and current (e.g., sense voltage 640) measurements may be taken. For example, simultaneous voltage 638 and current (e.g., sense voltage 640) measurements with a large number of samples may be requested. Voltage 638 and current (e.g., sense voltage 640) data (that could be used to measure a battery resistance) may be updated. For example, if indicated, the resistance monitoring block/module 650 may update a battery voltage 638 measurement (for measured resistance) and update a battery current (e.g., sense voltage 640) measurement (for measured resistance). It should be noted that the voltage data and the current data may only be a portion of measurement data that may be used to measure resistance. The battery monitoring circuit 602 may also stand by to update an open circuit voltage measurement (for measured resistance) at a next open circuit voltage measurement state.

The state machine 690 (e.g., FSM) may transition from the resistance measurement state to the high-load state if the low counter 678 reaches a fourth low counter limit or threshold or the meta counter 686 reaches a fourth meta counter limit or threshold. For example, the fourth low counter limit or threshold may be equal to one in the resistance measurement state. The transition may occur because the resistance measurement has either completed successfully or failed (after a single low measurement). In one configuration, if the transition is triggered by the meta counter 686, the resistance monitoring block/module 650 may be signaled. The state machine 690 (e.g., FSM) may transition from the resistance measurement state back to the resistance measurement state if the high counter 676 reaches a fourth high counter limit or threshold. In one configuration, the fourth high counter threshold may be equal to one. In this case, the battery monitoring circuit 602 may continue sampling current and voltage for an accurate resistance measurement.

While in the open circuit voltage measurement state, several operations may be performed. Simultaneous voltage 638 and current (e.g., sense voltage 640) measurements may be taken. For example, simultaneous voltage 638 and current (e.g., sense voltage 640) measurements with a large number of samples may be requested. If the battery voltage is settled, a first open circuit voltage (e.g., the most recent "good" open circuit voltage) value may be stored. Also, the coulomb counter 642 may be reset (to zero) if the battery voltage is settled. For example, the open circuit voltage monitoring block/module 646 may evaluate the battery voltage 638 and, if indicated, may update the first open circuit voltage data and reset the coulomb counter 642 to zero. Furthermore, if the battery voltage is settled and if new voltage and current measurements (that could be used to measure battery resistance) have been taken, then a second open circuit voltage (that could be used to measure battery resistance) may be stored. For example, the resistance monitoring block/module 650 may update the second open circuit voltage (that could be used to measure battery resistance) if indicated. This may complete the data that could be used to measure battery resistance.

The state machine 690 (e.g., FSM) may transition from the open circuit voltage measurement state to the low-load state if the low counter 678 reaches a third low counter limit or threshold or the meta counter 686 reaches a third meta counter limit or threshold. For example, the third low counter limit may be equal to one. The transition may occur because the open circuit voltage measurement has either completed successfully or failed repeatedly. If the transition was triggered by the low counter 678, the state machine 690 may send an open circuit voltage monitoring control signal 696 to the open circuit voltage monitoring block/module 646. The state machine 690 (e.g., FSM) may transition from the open circuit voltage measurement state back to the open circuit voltage measurement state if the high counter 676 reaches a third high counter limit or threshold. For example, the third high counter threshold may be equal to one. In this case, the open circuit voltage measurement may have occurred during a current spike (e.g., modem current spike), so the open circuit voltage measurement may be retried.

The multiplexer 605 may be coupled to a settings block/module 601 and to a controller 609. The settings block/module 601 may store settings for the operation of the battery monitoring circuit 602. One example of the settings block/module 601 is a system bus interface (SBI). The settings block/module 601 may receive settings input 698. The settings input 698 may include settings information that may be stored by the settings block/module 601 such as operation timing information (e.g., delay(s) between measurements, duty cycle(s), etc.), limits or thresholds for one or more states of the high counter 676 and the low counter 678, one or more sense voltage (e.g., battery current) thresholds and/or one or more numbers of samples per average, etc. The settings block/module 601 may provide the stored settings information 603 to the multiplexer 605.

In one configuration, the state machine 690 may provide a present state indication 644 to the multiplexer 605. The multiplexer 605 may provide selected settings information 607 to the controller 609 based on the present state indication 644. For example, the multiplexer 605 may select one or more pieces of settings information 603 to be provided to the controller 609 as selected settings information 607. The selected settings information 607 may include information that is relevant to a present state and/or state transition.

In one configuration, the controller 609 may control (e.g., provide control information to) one or more elements of the battery monitoring circuit 602 based on the selected settings information 607. For example, the controller 609 may be coupled to analog-to-digital converter B 628, to averaging block/module A 634, to averaging block/module B 636, to the open circuit voltage monitoring block/module 646, to the coulomb counter 642, to the resistance monitoring block/module 650, to the high counter 676, to the comparator 670 and/or to the low counter 678. Additionally or alternatively, the controller 609 may be coupled to analog-to-digital converter A 626.

The controller 609 may send a measurement request 633 to analog-to-digital converter A 626 that causes analog-to-digital converter A 626 to provide the digital battery voltage 630 to averaging block/module A 634. This may be done at a frequency based on the present state of the state machine 690.

The controller 609 may send a measurement request 627 to analog-to-digital converter B 628 that causes analog-to-digital converter B 628 to provide the digital sense voltage 632 to averaging block/module B 636. This may be done at a frequency based on the present state of the state machine 690.

The controller 609 may control averaging block/module A 634 and averaging block/module B 636. For example, the controller 609 may send a first number 625 to averaging block/module A 634. Averaging block/module A 634 may average a number of digital battery voltage 630 samples corresponding to the first number 625. Additionally or alternatively, the controller 609 may send a second number 623 to averaging block/module B 636. Averaging block/module B 636 may average a number of digital sense voltage 632 samples corresponding to the second number 623.

The controller 609 may communicate information 621 with the open circuit voltage monitoring block/module 646. For example, the controller 609 may send information 621 to the open circuit voltage monitoring block/module 646 and/or may receive information 621 from the open circuit voltage monitoring block/module 646. In one configuration, the open circuit voltage monitoring block/module 646 may send information 621 to the controller 609 indicating that the coulomb counter 642 should be reset. This may occur when an open circuit voltage measurement 652 is updated and/or provided to the output registers 658. The controller 609 may use this information 621 to send a reset signal 619 to the coulomb counter 642.

The controller 609 may optionally send control information 621, 617 to the open circuit monitoring block/module 646 and/or the resistance monitoring block/module 650. For example, the controller 609 may send synchronization and/or timing information 621, 617 to the open circuit monitoring block/module 646 and/or the resistance monitoring block/module 650.

The controller 609 may provide a high counter limit or threshold 615 to the high counter 676. For example, the high counter limit or threshold 615 used by the high counter 676 may depend on the present state of the state machine 690. For instance, the controller 609 may provide one or more high counter limits or thresholds 615 to the high counter 676 based on the present state.

The controller 609 may provide a low counter limit or threshold 611 to the low counter 678. For example, the low counter limit or threshold 611 used by the low counter 678 may depend on the present state of the state machine 690. For instance, the controller 609 may provide one or more low counter limits or thresholds 611 to the low counter 678 based on the present state.

The controller 609 may provide a threshold 613 (e.g., a battery current threshold or sense voltage threshold) to the comparator 670. For example, the threshold 613 used by the comparator 670 may depend on the present state of the state machine 690. For instance, the controller 609 may provide one or more thresholds 613 to the comparator 670 based on the present state.

As illustrated in FIG. 6, the power management circuit 661 may be coupled to the processor 677. One example of the processor 677 is an application processor on an electronic device, such as a cellular phone, smartphone, audio player, etc. The output registers 658 may provide the open circuit voltage data 660, consumed charge data 662, resistance monitoring open circuit voltage data 664, resistance monitoring voltage data 666 and/or resistance monitoring sense voltage data 668 to the processor 677. For example, the battery monitoring circuit 602 may simply provide information 660, 662, 664, 666, 668 to the processor 677 and/or notify the processor 677 that the information 660, 662, 664, 666, 668 is ready. However, the battery monitoring circuit 602 may operate autonomously from the processor 677, allow the processor 677 to retrieve the information 660, 662, 664, 666, 668 when needed/desired. The processor 677 may use one or more pieces of information 660, 662, 664, 666, 668 to compute a state of charge of the battery 604. For example, the processor 677 may perform computations according to Equations (1)-(4) given above. In some configurations, the battery monitoring circuit 602 may provide an override mode for software-driven operation and debugging.

The processor 677 may also provide settings input 698 to the battery monitoring circuit 602. For example, a user may input settings information (e.g., limits, thresholds, duty cycle, etc.) into an electronic device. The processor 677 may provide the settings information to the battery monitoring circuit 602. Thus, the battery monitoring circuit 602 may be adapted to work with various types of batteries and discharge profiles.

As illustrated in FIG. 6, the power management circuit 661 may include analog-to-digital converter A 626. In some configurations, analog-to-digital converter A 626 may be used for other purposes on an electronic device and may be (partially) repurposed for use by the battery monitoring circuit 602. Thus, the battery monitoring circuit 602 may be integrated into a power management circuit 661 with an existing design, without having to re-design the entire power management circuit 661. In some configurations, analog-to-digital converter B 628 may be dedicated solely for the use of the battery monitoring circuit 602.

Figure 7:
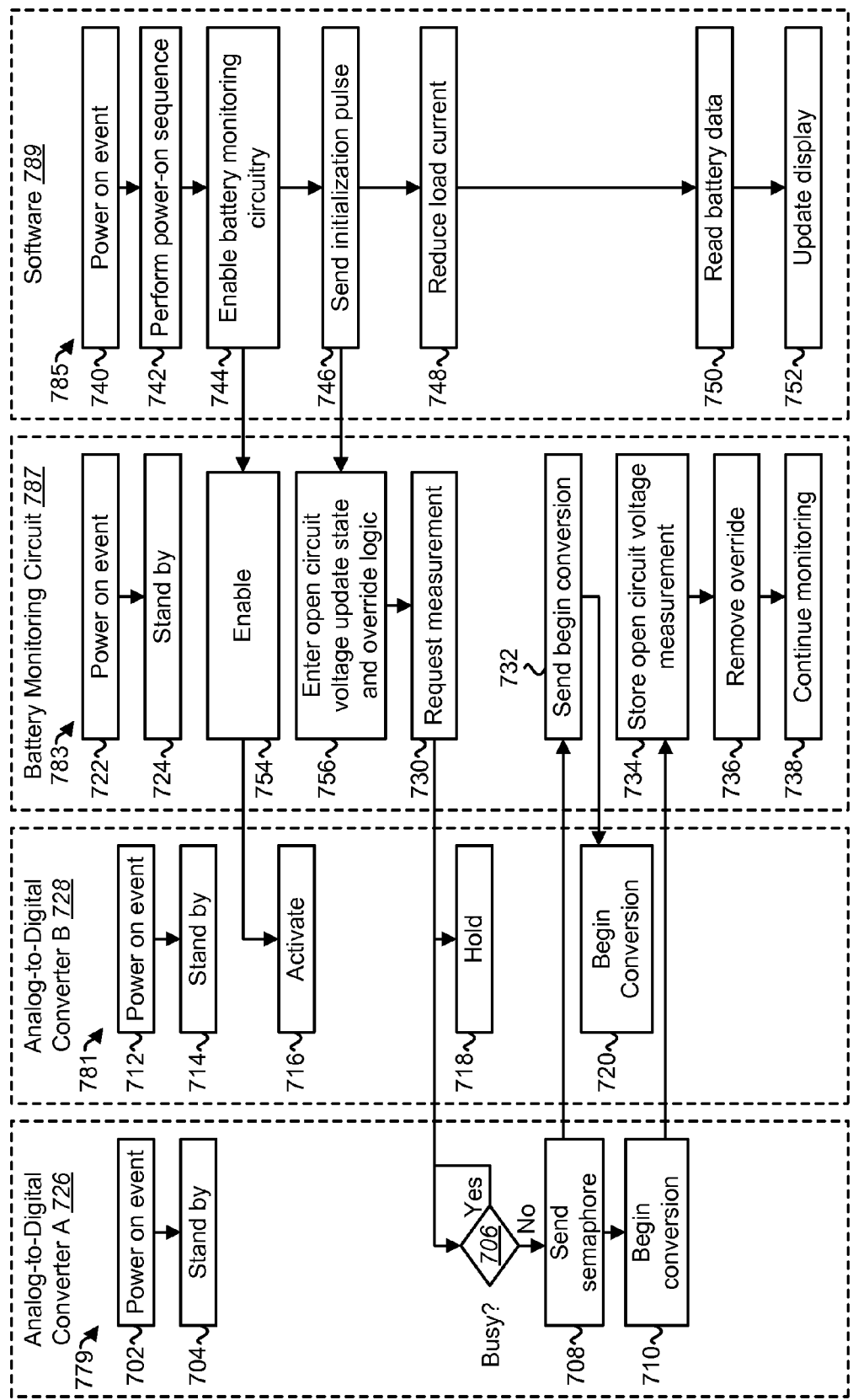
FIG. 7 is a flow diagram illustrating one example of several methods for performing an initialization procedure.

FIG. 7 is a flow diagram illustrating one example of several methods 779, 781, 783, 785 for performing an initialization procedure. For instance, the methods 779, 781, 783, 785 may be performed in order to initialize an electronic device and/or battery monitoring circuit 102. In FIG. 7, a method 779 may be performed by analog-to-digital converter A 726, another method 781 may be performed by analog-to-digital converter B 728, another method 783 may be performed by a battery monitoring circuit 787 and yet another method 785 may be performed by software 789 (e.g., software running on a processor 677).

When a device is initially powered on, analog-to-digital converter A 726, analog-to-digital converter B 728, the battery monitoring circuit 787 and software 789 may respectively detect or experience a power on event 702, 712, 722, 740. Analog-to-digital converter A 726 may proceed to stand by 704 for further operation. Analog-to-digital converter B 728 may also proceed to stand by 714 for further operation. Furthermore, the battery monitoring circuit 787 may proceed to stand by 724 for further operation.

The software 789 may perform 742 a power-on sequence. For example, the software 789 may direct various blocks or circuits to power on and/or to perform other start-up operations. The software 789 may enable 744 a battery monitoring circuit. For example, the software 789 may send a command, message or information to the battery monitoring circuit 787 to begin operating. The battery monitoring circuit 787 may enable 754 itself by switching on various components, elements, circuits, etc. For example, the circuit 787 may switch on analog-to-digital converter B 728. Thus, analog-to-digital converter B 728 may activate 716 or begin operating (e.g., begin converting analog signals to digital signals).

The software 789 may send 746 an initialization pulse to the battery monitoring circuit 787. For example, the software 789 may send a signal to the circuit 787 indicating an initialization procedure. The software 789 may also reduce 748 load current. For example, the software 789 may command various blocks/modules to reduce current consumption, which may enable a more accurate reading.

The battery monitoring circuit 787 may enter 756 an open circuit update state and override logic. For example, the battery monitoring circuit 787 may override the operation of the open circuit voltage monitoring block/module 646. The battery monitoring circuit 787 may also request 730 a measurement. For example, the battery monitoring circuit 787 may send an instruction to analog-to-digital converter A 726 requesting a measurement. This instruction may also be sent to analog-to-digital converter B 728 to hold 718 or suspend operation temporarily.

Analog-to-digital converter A 726 may determine 706 whether or not it is busy. For example, analog-to-digital converter A 726 may determine whether it 726 is currently in the process of converting another signal. If it 726 is busy, analog-to-digital converter A 726 may return (after a delay, for example) to determining 706 whether it 726 is busy. If analog-to-digital converter A 726 is not busy, then it 726 may send 708 a semaphore to the battery monitoring circuit 787.

The battery monitoring circuit 787 may send 732 a begin conversion instruction (in response to receiving the semaphore) to analog-to-digital converter B 728. Thus, analog-to-digital converter B 728 may begin 720 converting an analog signal (e.g., sense voltage measurement) at roughly the same time that analog-to-digital converter A 726 begins 710 conversion of its analog signal (e.g., voltage measurement). Analog-to-digital converter A 726 may provide an open circuit voltage measurement to the battery monitoring circuit 787. The battery monitoring circuit 787 may store 734 the open circuit voltage measurement.

The battery monitoring circuit 787 may remove 736 the override and continue 738 monitoring. In other words, the battery monitoring circuit 787 may begin normal or typical operation.

The software 789 may optionally read 750 battery data. For example, the software 789 may retrieve battery data 660, 662, 664, 666, 668 provided by the battery monitoring circuit 787. The software 789 may update 752 a display. For example, the software 789 may perform calculations based on the battery data 660, 662, 664, 666, 668 and/or update 752 a display. In one configuration, the display may show a state of charge, for example.

Figure 8:
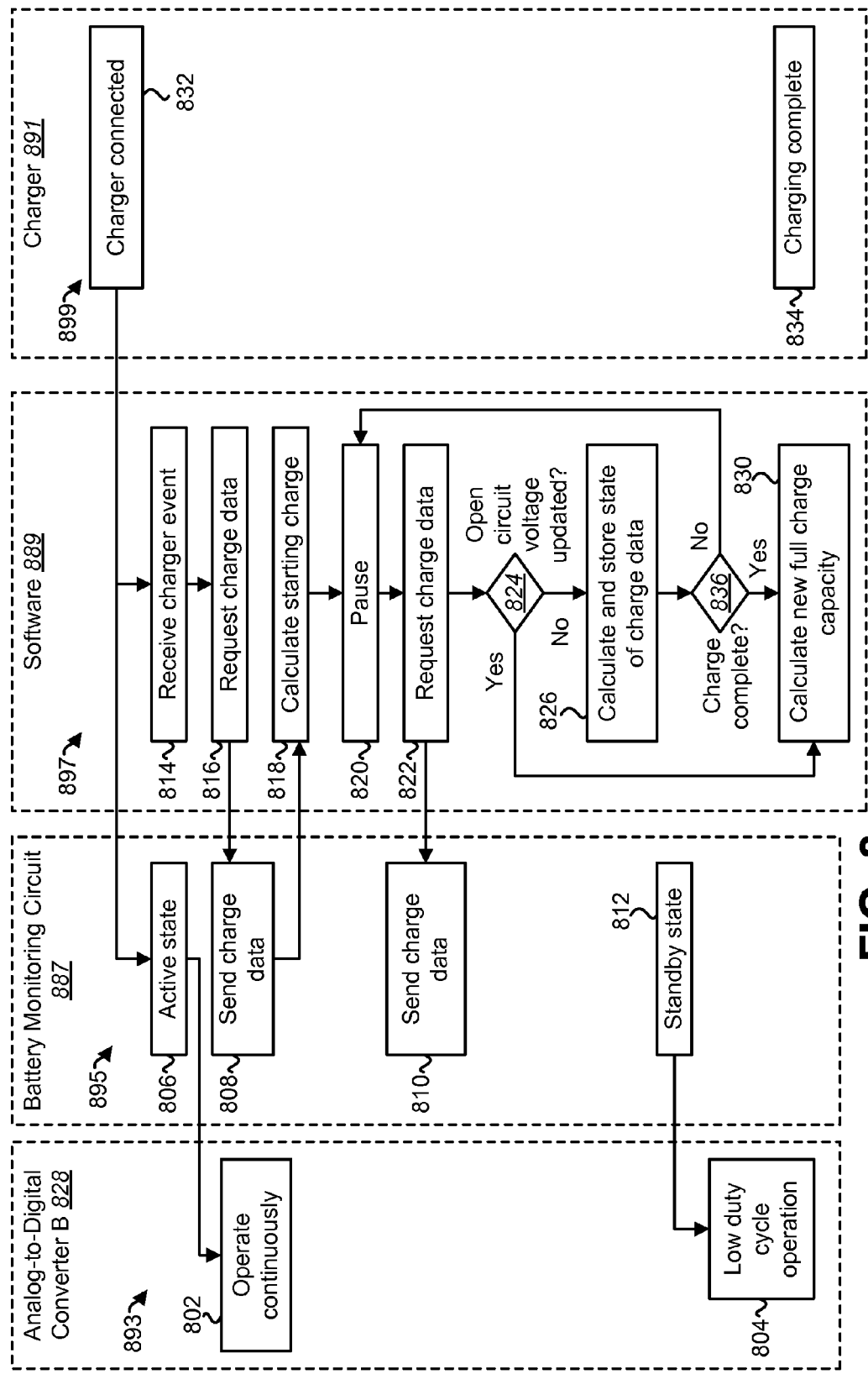
FIG. 8 is a flow diagram illustrating one example of several methods for performing a charging procedure.

FIG. 8 is a flow diagram illustrating one example of several methods 893, 895, 897, 899 for performing a charging procedure. For instance, the methods 893, 895, 897, 899 may be performed in order to determine a full charge capacity (FCC). In FIG. 8, a method 893 may be performed by analog-to-digital converter B 828, another method 895 may be performed by a battery monitoring circuit 887, another method 897 may be performed by software 889 (e.g., software running on a processor 677), and yet another method 899 may be performed by a charger 891 or charger interface block(s)/module(s).

A charger 891 may be connected 832. For example, an electronic device may detect that a charging device is providing electrical energy to charge a battery. In one configuration, charger interface circuitry may send a notification or event to the software 889. The software 889 may receive 814 the charger event. At this time, the battery monitoring circuit 887 may transition 806 or be placed into in an active state. The battery monitoring circuit 887 may indicate this state to analog-to-digital converter B 828. Analog-to-digital converter B 828 may begin to operate 802 continuously.

The software 889 may request 816 charge data from the battery monitoring circuit 887. The battery monitoring circuit 887 may send 808 charge data (e.g., one or more pieces of battery data 660, 662, 664, 666, 668) in response. The software 889 may use the charge data to calculate 818 a starting charge. The software 889 may pause 820 or delay for a time. The software 889 may again request 822 charge data from the battery monitoring circuit 887. The battery monitoring circuit 887 may send 810 the requested charge data to the software (e.g., processor) 889. The circuit 887 may eventually enter 812 a standby state and signal analog-to-digital converter B 828. Analog-to-digital converter B 828 may operate 804 at a low-duty cycle (e.g., low frequency).

The software 889 may determine 824 whether an open circuit voltage has been updated. If the open circuit voltage has been updated, the software 889 may calculate 830 a new full charge capacity (FCC). If the open circuit voltage has not been updated, the software 889 may calculate 826 and store state of charge data. The software 889 may determine 836 whether the charge is complete. For example, the software 889 may determine 836 whether the open circuit voltage has increased since a previous measurement.

If the open circuit voltage has increased, charging may not be complete and the software 889 may return to pause 820. If charging is complete, the software 889 may calculate 830 a new full charge capacity (FCC). At this point, the charging may be completed 834 by the charger 891.

Figure 9:
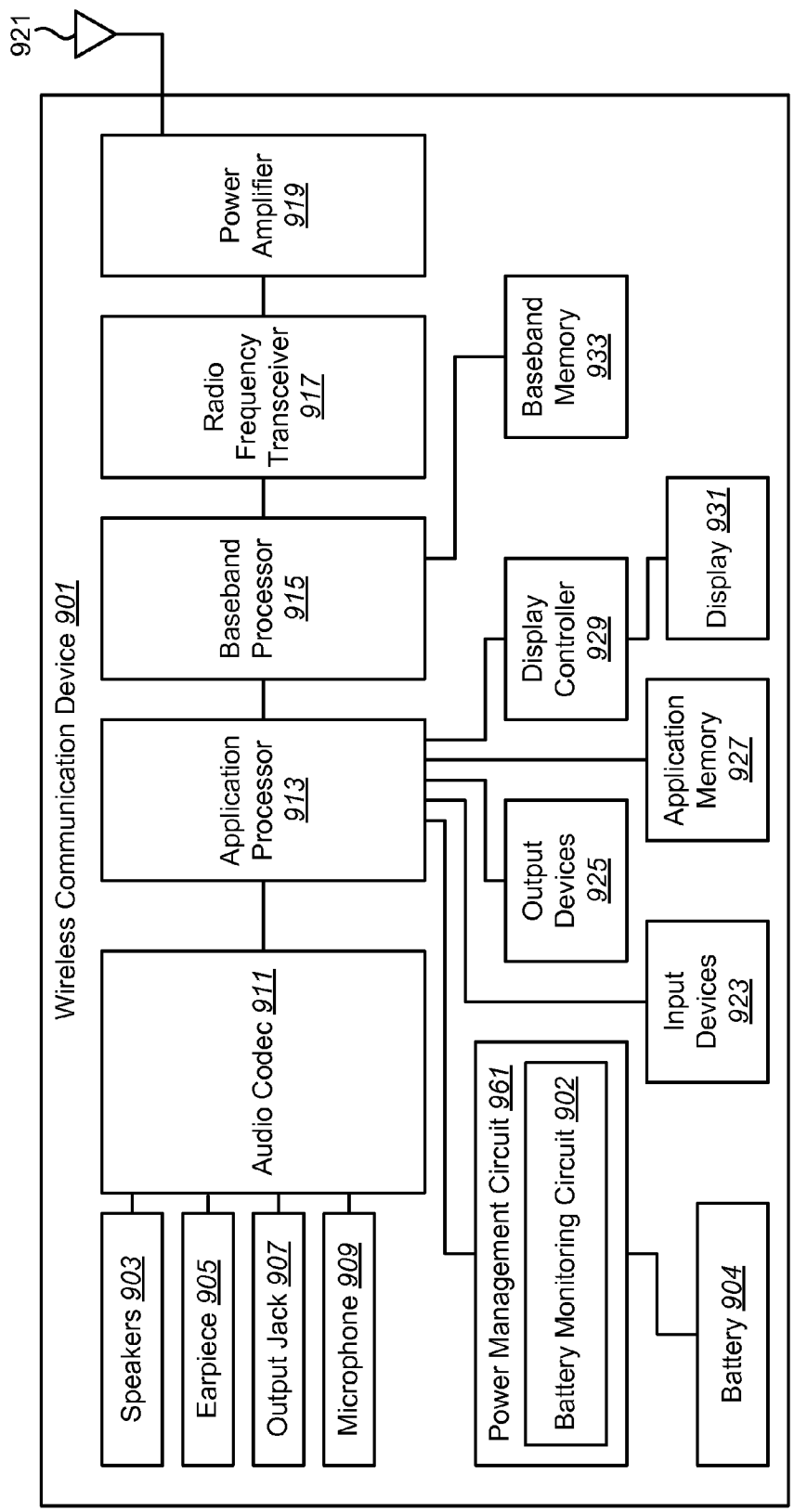
FIG. 9 is a block diagram illustrating one configuration of a wireless communication device in which a battery monitoring circuit may be implemented.

FIG. 9 is a block diagram illustrating one configuration of a wireless communication device 901 in which a battery monitoring circuit 902 may be implemented. The wireless communication device 901 may include an application processor 913. The application processor 913 generally processes instructions (e.g., runs programs) to perform functions on the wireless communication device 901. The application processor 913 may be coupled to an audio coder/decoder (codec) 911.

The audio codec 911 may be an electronic device (e.g., integrated circuit) used for coding and/or decoding audio signals. The audio codec 911 may be coupled to one or more speakers 903, an earpiece 905, an output jack 907 and/or one or more microphones 909. The speakers 903 may include one or more electro-acoustic transducers that convert electrical or electronic signals into acoustic signals. For example, the speakers 903 may be used to play music or output a speakerphone conversation, etc. The earpiece 905 may be another speaker or electro-acoustic transducer that can be used to output acoustic signals (e.g., speech signals) to a user. For example, the earpiece 905 may be used such that only a user may reliably hear the acoustic signal. The output jack 907 may be used for coupling other devices to the wireless communication device 901 for outputting audio, such as headphones. The speakers 903, earpiece 905 and/or output jack 907 may generally be used for outputting an audio signal from the audio codec 911. The one or more microphones 909 may be acousto-electric transducer that converts an acoustic signal (such as a user's voice) into electrical or electronic signals that are provided to the audio codec 911.

The application processor 913 may also be coupled to a power management circuit 961. One example of a power management circuit 961 is a power management integrated circuit (PMIC), which may be used to manage the electrical power consumption of the wireless communication device 901. The power management circuit 961 may be coupled to a battery 904. The battery 904 may generally provide electrical power to the wireless communication device 901.

The power management circuit 961 may include a battery monitoring circuit 902. Examples of the battery monitoring circuit 902 may include the battery monitoring circuit 102 illustrated in FIG. 1 and the battery monitoring circuit 602 illustrated in FIG. 6. It should also be noted that one example of the application processor 913 may be the processor 677 illustrated in FIG. 6.

The application processor 913 may be coupled to one or more input devices 923 for receiving input. Examples of input devices 923 include infrared sensors, image sensors, accelerometers, touch sensors, keypads, etc. The input devices 923 may allow user interaction with the wireless communication device 901. The application processor 913 may also be coupled to one or more output devices 925. Examples of output devices 925 include printers, projectors, screens, haptic devices, etc. The output devices 925 may allow the wireless communication device 901 to produce output that may be experienced by a user.

The application processor 913 may be coupled to application memory 927. The application memory 927 may be any electronic device that is capable of storing electronic information. Examples of application memory 927 include double data rate synchronous dynamic random access memory (DDRAM), synchronous dynamic random access memory (SDRAM), flash memory, etc. The application memory 927 may provide storage for the application processor 913. For instance, the application memory 927 may store data and/or instructions for the functioning of programs that are run on the application processor 913.

The application processor 913 may be coupled to a display controller 929, which in turn may be coupled to a display 931. The display controller 929 may be a hardware block that is used to generate images on the display 931. For example, the display controller 929 may translate instructions and/or data from the application processor 913 into images that can be presented on the display 931. Examples of the display 931 include liquid crystal display (LCD) panels, light emitting diode (LED) panels, cathode ray tube (CRT) displays, plasma displays, etc.

The application processor 913 may be coupled to a baseband processor 915. The baseband processor 915 generally processes communication signals. For example, the baseband processor 915 may demodulate and/or decode received signals. Additionally or alternatively, the baseband processor 915 may encode and/or modulate signals in preparation for transmission.

The baseband processor 915 may be coupled to baseband memory 933. The baseband memory 933 may be any electronic device capable of storing electronic information, such as SDRAM, DDRAM, flash memory, etc. The baseband processor 915 may read information (e.g., instructions and/or data) from and/or write information to the baseband memory 933. Additionally or alternatively, the baseband processor 915 may use instructions and/or data stored in the baseband memory 933 to perform communication operations.

The baseband processor 915 may be coupled to a radio frequency (RF) transceiver 917. The RF transceiver 917 may be coupled to a power amplifier 919 and one or more antennas 921. The RF transceiver 917 may transmit and/or receive radio frequency signals. For example, the RF transceiver 917 may transmit an RF signal using a power amplifier 919 and one or more antennas 921. The RF transceiver 917 may also receive RF signals using the one or more antennas 921. Examples of the wireless communication device 901 include cellular phones, smart phones, laptop computers, personal digital assistants (PDAs), audio players, wireless modems, gaming systems, etc.

Figure 10:
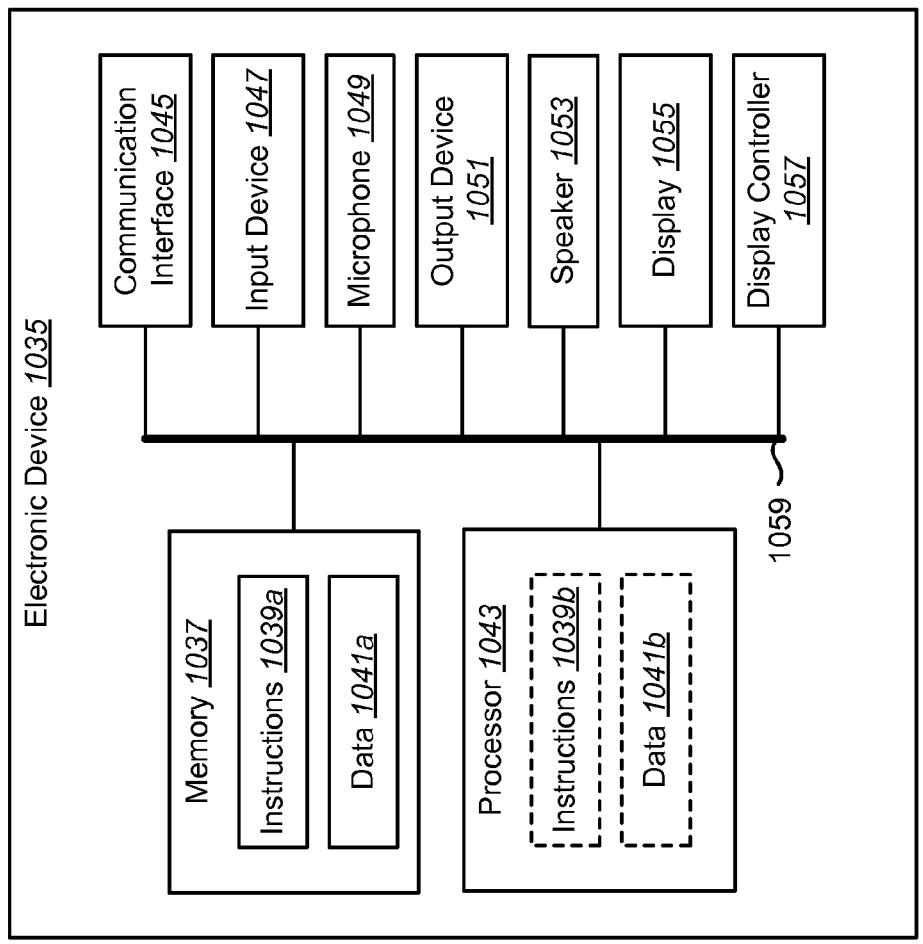
FIG. 10 illustrates various components that may be utilized in an electronic device.

FIG. 10 illustrates various components that may be utilized in an electronic device 1035. The illustrated components may be located within the same physical structure or in separate housings or structures. A battery monitoring circuit 102, 602 may be implemented in the electronic device 1035. The electronic device 1035 includes a processor 1043. The processor 1043 may be a general purpose single- or multi-chip microprocessor (e.g., an ARM), a special purpose microprocessor (e.g., a digital signal processor (DSP)), a microcontroller, a programmable gate array, etc. The processor 1043 may be referred to as a central processing unit (CPU). Although just a single processor 1043 is shown in the electronic device 1035 of FIG. 10, in an alternative configuration, a combination of processors (e.g., an ARM and DSP) could be used.

The electronic device 1035 also includes memory 1037 in electronic communication with the processor 1043. That is, the processor 1043 can read information from and/or write information to the memory 1037. The memory 1037 may be any electronic component capable of storing electronic information. The memory 1037 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1041a and instructions 1039a may be stored in the memory 1037. The instructions 1039a may include one or more programs, routines, sub-routines, functions, procedures, etc. The instructions 1039a may include a single computer-readable statement or many computer-readable statements. The instructions 1039a may be executable by the processor 1043 to implement one or more of the methods 300, 500, 783, 785, 895, 897 described above. Executing the instructions 1039a may involve the use of the data 1041a that is stored in the memory 1037. FIG. 10 shows some instructions 1039b and data 1041b being loaded into the processor 1043 (which may come from instructions 1039a and data 1041a).

The electronic device 1035 may also include one or more communication interfaces 1045 for communicating with other electronic devices. The communication interfaces 1045 may be based on wired communication technology, wireless communication technology, or both. Examples of different types of communication interfaces 1045 include a serial port, a parallel port, a Universal Serial Bus (USB), an Ethernet adapter, an IEEE 1394 bus interface, a small computer system interface (SCSI) bus interface, an infrared (IR) communication port, a Bluetooth wireless communication adapter, and so forth.

The electronic device 1035 may also include one or more input devices 1047 and one or more output devices 1051. Examples of different kinds of input devices 1047 include a keyboard, mouse, microphone, remote control device, button, joystick, trackball, touchpad, lightpen, etc. For instance, the electronic device 1035 may include one or more microphones 1049 for capturing acoustic signals. In one configuration, a microphone 1049 may be a transducer that converts acoustic signals (e.g., voice, speech) into electrical or electronic signals. Examples of different kinds of output devices 1051 include a speaker, printer, etc. For instance, the electronic device 1035 may include one or more speakers 1053. In one configuration, a speaker 1053 may be a transducer that converts electrical or electronic signals into acoustic signals. One specific type of output device which may be typically included in an electronic device 1035 is a display device 1055. Display devices 1055 used with configurations disclosed herein may utilize any suitable image projection technology, such as a cathode ray tube (CRT), liquid crystal display (LCD), light-emitting diode (LED), gas plasma, electroluminescence, or the like. A display controller 1057 may also be provided, for converting data stored in the memory 1037 into text, graphics, and/or moving images (as appropriate) shown on the display device 1055.

The various components of the electronic device 1035 may be coupled together by one or more buses, which may include a power bus, a control signal bus, a status signal bus, a data bus, etc. For simplicity, the various buses are illustrated in FIG. 10 as a bus system 1059. It should be noted that FIG. 10 illustrates only one possible configuration of an electronic device 1035. Various other architectures and components may be utilized.

Figure 11:
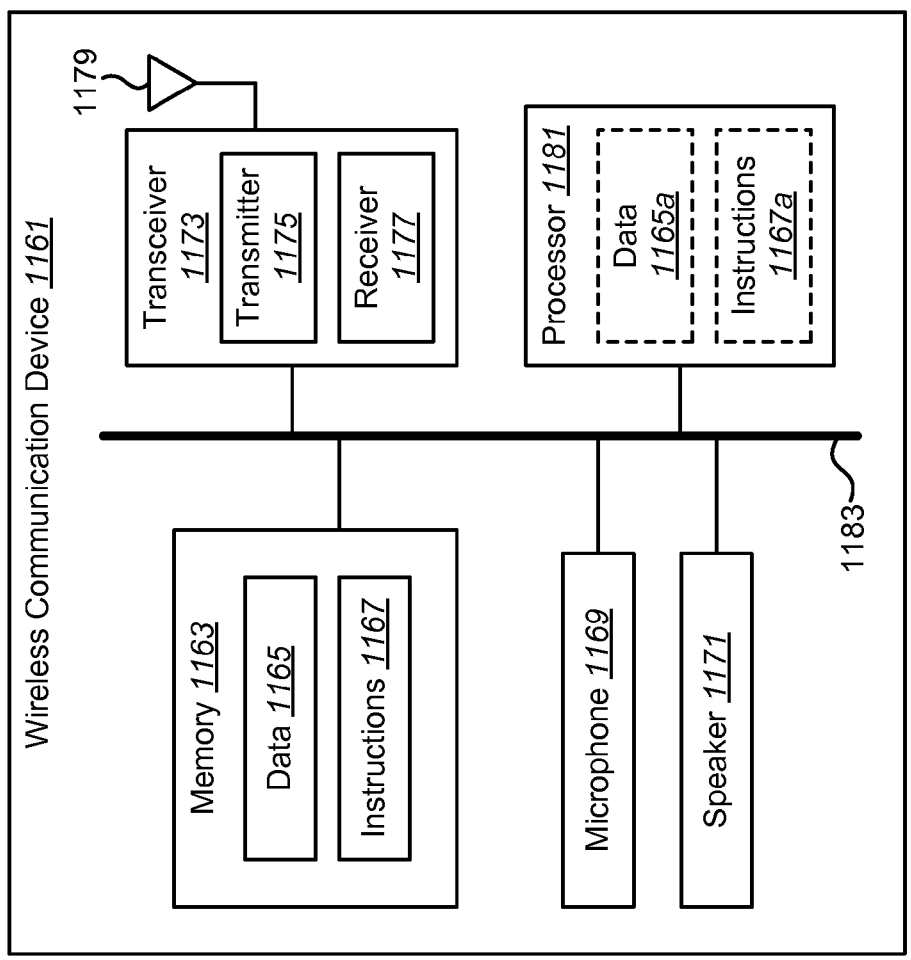
FIG. 11 illustrates certain components that may be included within a wireless communication device.

FIG. 11 illustrates certain components that may be included within a wireless communication device 1161. A battery monitoring circuit 102, 602 may be implemented in the wireless communication device 1161.

The wireless communication device 1161 includes a processor 1181. The processor 1181 may be a general purpose single- or multi-chip microprocessor (e.g., an ARM), a special purpose microprocessor (e.g., a digital signal processor (DSP)), a microcontroller, a programmable gate array, etc. The processor 1181 may be referred to as a central processing unit (CPU). Although just a single processor 1181 is shown in the wireless communication device 1161 of FIG. 11, in an alternative configuration, a combination of processors (e.g., an ARM and DSP) could be used.

The wireless communication device 1161 also includes memory 1163 in electronic communication with the processor 1181 (i.e., the processor 1181 can read information from and/or write information to the memory 1163). The memory 1163 may be any electronic component capable of storing electronic information. The memory 1163 may be random access memory (RAM), read-only memory (ROM), magnetic disk storage media, optical storage media, flash memory devices in RAM, on-board memory included with the processor, programmable read-only memory (PROM), erasable programmable read-only memory (EPROM), electrically erasable PROM (EEPROM), registers, and so forth, including combinations thereof.

Data 1165 and instructions 1167 may be stored in the memory 1163. The instructions 1167 may include one or more programs, routines, sub-routines, functions, procedures, code, etc. The instructions 1167 may include a single computer-readable statement or many computer-readable statements. The instructions 1167 may be executable by the processor 1181 to implement one or more of the methods 300, 500, 783, 785, 895, 897 described above. Executing the instructions 1167 may involve the use of the data 1165 that is stored in the memory 1163. FIG. 11 shows some instructions 1167a and data 1165a being loaded into the processor 1181 (which may come from instructions 1167 and data 1165).

The wireless communication device 1161 may also include a transmitter 1175 and a receiver 1177 to allow transmission and reception of signals between the wireless communication device 1161 and a remote location (e.g., another electronic device, wireless communication device, etc.). The transmitter 1175 and receiver 1177 may be collectively referred to as a transceiver 1173. An antenna 1179 may be electrically coupled to the transceiver 1173. The wireless communication device 1161 may also include (not shown) multiple transmitters, multiple receivers, multiple transceivers and/or multiple antenna.

In some configurations, the wireless communication device 1161 may include one or more microphones 1169 for capturing acoustic signals. In one configuration, a microphone 1169 may be a transducer that converts acoustic signals (e.g., voice, speech) into electrical or electronic signals. Additionally or alternatively, the wireless communication device 1161 may include one or more speakers 1171. In one configuration, a speaker 1171 may be a transducer that converts electrical or electronic signals into acoustic signals.

The various components of the wireless communication device 1161 may be coupled together by one or more buses, which may include a power bus, a control signal bus, a status signal bus, a data bus, etc. For simplicity, the various buses are illustrated in FIG. 11 as a bus system 1183.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A battery monitoring circuit, comprising:
    a high counter that increments when a sense voltage measurement is above a threshold;
    a low counter that increments when the sense voltage measurement is below the threshold;
    state machine circuitry coupled to the high counter and to the low counter;
    open circuit voltage monitoring circuitry coupled to the state machine circuitry; and
    resistance monitoring circuitry coupled to the state machine circuitry;
    wherein the state machine circuitry transitions from a low-load state to a high-load state when the high counter reaches a first high counter limit; and
    wherein the state machine circuitry transitions from the high-load state to the low-load state when the low counter reaches a second low counter limit.

2. The battery monitoring circuit of claim 1, further comprising:
    a coulomb counter; and
    output registers for storing measurements coupled to the open circuit voltage monitoring circuitry, coupled to the coulomb counter and coupled to the resistance monitoring circuitry.

3. The battery monitoring circuit of claim 1, wherein the state machine circuitry operates according to the high-load state, the low-load state, a resistance measurement state and an open circuit voltage measurement state.

4. The battery monitoring circuit of claim 1, wherein the battery monitoring circuit operates autonomously from a software processor.

5. The battery monitoring circuit of claim 1, wherein the battery monitoring circuit uses an analog-to-digital converter.

6. The battery monitoring circuit of claim 1, wherein the battery monitoring circuit is integrated into a power management circuit.

7. The battery monitoring circuit of claim 1, wherein if the state machine circuitry indicates the low-load state, the battery monitoring circuit:
    measures the sense voltage at a lower frequency;
    determines whether a first low counter limit has been reached by the low counter or the first high counter limit has been reached by the high counter; and
    transitions, by the state machine circuitry, to an open circuit voltage measurement state if the first low counter limit has been reached.

8. The battery monitoring circuit of claim 1, wherein if the state machine indicates the high-load state, the battery monitoring circuit:
    measures the sense voltage at a higher frequency;
    determines whether the second low counter limit has been reached by the low counter or a second meta counter limit has been reached by a meta counter; and
    transitions, by the state machine circuitry, to a resistance measurement state if the second meta counter limit has been reached.

9. The battery monitoring circuit of claim 1, wherein if the state machine circuitry indicates an open circuit voltage measurement state, the battery monitoring circuit:
    obtains a battery voltage measurement and a sense voltage measurement;
    determines whether a third low counter limit has been reached by the low counter or a third meta counter limit has been reached by a meta counter;
    transitions, by the state machine circuitry, to the low-load state if the third meta counter limit has been reached;
    determines, by the open circuit voltage monitoring circuitry, whether a voltage is settled if the third low counter limit has been reached;
    updates, by the open circuit voltage monitoring circuitry, an open circuit voltage measurement if the voltage is settled;
    resets, by a controller, a coulomb counter if the voltage is settled; and
    updates, by the resistance monitoring circuitry, a resistance monitoring open circuit voltage measurement if the voltage is settled and if a previous resistance monitoring battery voltage measurement and a previous resistance monitoring sense voltage measurement have been taken.

10. The battery monitoring circuit of claim 9, wherein if the state machine circuitry indicates an open circuit voltage measurement state, the battery monitoring circuit further:
    determines whether a third high counter limit has been reached by the high counter, and if the third high counter limit has been reached, then:
    transitions, by the state machine circuitry, to the open circuit voltage measurement state.

11. The battery monitoring circuit of claim 1, wherein if the state machine circuitry indicates a resistance measurement state, the battery monitoring circuit:
    obtains a battery voltage measurement and a sense voltage measurement;
    determines whether a fourth low counter limit has been reached by the low counter or a fourth high counter limit has been reached by the high counter;
    transitions, by the state machine circuitry, to the high-load state if the fourth low counter limit has been reached; and
    transitions, by the state machine circuitry, to the resistance measurement state if the fourth high counter limit has been reached.

12. The battery monitoring circuit of claim 11, wherein if the state machine circuitry indicates a resistance measurement state, the battery monitoring circuit further:
    determines whether a fourth meta counter limit has been reached by a meta counter, and if the fourth meta counter limit has been reached, then:
    updates, by the resistance monitoring circuitry, a resistance monitoring battery voltage;
    updates, by the resistance monitoring circuitry, a resistance monitoring sense voltage; and
    stands by, by the resistance monitoring circuitry, to update a resistance monitoring open circuit voltage.

13. The battery monitoring circuit of claim 1, wherein the battery monitoring circuit provides an open circuit voltage measurement, a consumed charge measurement, a resistance monitoring open circuit voltage measurement, a resistance monitoring battery voltage measurement and a resistance monitoring sense voltage measurement to a processor.

14. A method for monitoring a battery, comprising:
    incrementing a high counter when a sense voltage measurement is above a threshold;

incrementing a low counter when the sense voltage measurement is below the threshold;
controlling a state based on a high counter limit and a low counter limit;
controlling open circuit voltage monitoring circuitry based on the state; and
controlling resistance monitoring circuitry based on the state;
wherein the state transitions from a low-load state to a high-load state when the high counter reaches a first high counter limit; and
wherein the state transitions from the high-load state to the low-load state when the low counter reaches a second low counter limit.

15. The method of claim 14, further comprising:
controlling a coulomb counter based on the state; and
storing measurements in output registers from the open circuit voltage monitoring circuitry, the coulomb counter and the resistance monitoring circuitry based on the state.

16. The method of claim 14, wherein the state transitions between the high-load state, the low-load state, a resistance measurement state and an open circuit voltage measurement state.

17. The method of claim 14, wherein the method is performed without a software processor.

18. The method of claim 14, wherein the method uses an analog-to-digital converter.

19. The method of claim 14, wherein the method is performed by a power management circuit.

20. The method of claim 14, wherein if the state is the low-load state, the method further comprises:
measuring the sense voltage at a lower frequency;
determining whether a first low counter limit has been reached or the first high counter limit has been reached; and
transitioning to an open circuit voltage measurement state if the first low counter limit has been reached.

21. The method of claim 14, wherein if the state is the high-load state, the method further comprises:
measuring the sense voltage at a higher frequency;
determining whether the second low counter limit has been reached or a second meta counter limit has been reached; and
transitioning to a resistance measurement state if the second meta counter limit has been reached.

22. The method of claim 14, wherein if the state is an open circuit voltage measurement state, the method further comprises:
obtaining a battery voltage measurement and a sense voltage measurement;
determining whether a third low counter limit has been reached or a third meta counter limit has been reached;
transitioning to the low-load state if the third meta counter limit has been reached;
determining whether a voltage is settled if the third low counter limit has been reached;
updating an open circuit voltage measurement if the voltage is settled;
resetting a coulomb counter if the voltage is settled; and
updating a resistance monitoring open circuit voltage measurement if the voltage is settled and if a previous resistance monitoring battery voltage measurement and a previous resistance monitoring sense voltage measurement have been taken.

23. The method of claim 22, wherein if the state is an open circuit voltage measurement state, the method further comprises:
determining whether a third high counter limit has been reached, and if the third high counter limit has been reached, then:
transitioning to the open circuit voltage measurement state.

24. The method of claim 14, wherein if the state is a resistance measurement state, the method further comprises:
obtaining a battery voltage measurement and a sense voltage measurement;
determining whether a fourth low counter limit has been reached or a fourth high counter limit has been reached;
transitioning to the high-load state if the fourth low counter limit has been reached; and
transitioning to the resistance measurement state if the fourth high counter limit has been reached.

25. The method of claim 24, wherein if the state is a resistance measurement state, the method further comprises:
determining whether a fourth meta counter limit has been reached, and if the fourth meta counter limit has been reached, then:
updating a resistance monitoring battery voltage;
updating a resistance monitoring sense voltage; and
standing by to update a resistance monitoring open circuit voltage.

26. The method of claim 14, further comprising providing an open circuit voltage measurement, a consumed charge measurement, a resistance monitoring open circuit voltage measurement, a resistance monitoring battery voltage measurement and a resistance monitoring sense voltage measurement to a processor.

27. A computer-program product for monitoring a battery, comprising a non-transitory tangible computer-readable medium having instructions that, when run on a processor, cause the processor to:
cause a high counter to increment when a sense voltage measurement is above a threshold;
cause a low counter to increment when the sense voltage measurement is below the threshold;
cause a battery monitoring circuit to control a state based on a high counter limit and a low counter limit;
cause the battery monitoring circuit to control open circuit voltage monitoring circuitry based on the state; and
cause the battery monitoring circuit to control resistance monitoring circuitry based on the state;
wherein the state transitions from a low-load state to a high-load state when the high counter reaches a first high counter limit; and
wherein the state transitions from the high-load state to the low-load state when the low counter reaches a second low counter limit.

28. The computer-program product of claim 27, wherein the instructions further cause the processor to:
cause the battery monitoring circuit to control a coulomb counter based on the state; and
cause the battery monitoring circuit to store measurements in output registers from the open circuit voltage monitoring circuitry, the coulomb counter and the resistance monitoring circuitry based on the state.

29. The computer-program product of claim 27, wherein the state transitions between the high-load state, the low-load state, a resistance measurement state and an open circuit voltage measurement state.

30. The computer-program product of claim 27, wherein the battery monitoring circuit uses an analog-to-digital converter.

31. The computer-program product of claim 27, wherein the battery monitoring circuit is integrated into a power management circuit.

32. The computer-program product of claim 27, wherein the battery monitoring circuit provides an open circuit voltage measurement, a consumed charge measurement, a resistance monitoring open circuit voltage measurement, a resistance monitoring battery voltage measurement and a resistance monitoring sense voltage measurement to the processor.

33. An apparatus for monitoring a battery, comprising:
   means for incrementing a high counter when a sense voltage measurement is above a threshold;
   means for incrementing a low counter when the sense voltage measurement is below the threshold;
   means for controlling a state based on a high counter limit and a low counter limit;
   means for controlling open circuit voltage monitoring circuitry based on the state; and
   means for controlling resistance monitoring circuitry based on the state;
   wherein the state transitions from a low-load state to a high-load state when the high counter reaches a first high counter limit; and
   wherein the state transitions from the high-load state to the low-load state when the low counter reaches a second low counter limit.

34. The apparatus of claim 33, further comprising:
   means for controlling a coulomb counter based on the state; and
   means for storing measurements in output registers from the open circuit voltage monitoring circuitry, the coulomb counter and the resistance monitoring circuitry based on the state.

35. The apparatus of claim 33, wherein the state transitions between the high-load state, the low-load state, a resistance measurement state and an open circuit voltage measurement state.

36. The apparatus of claim 33, wherein the apparatus uses an analog-to-digital converter.

37. The apparatus of claim 33, wherein the apparatus is integrated into a power management circuit.

38. The apparatus of claim 33, wherein the apparatus provides an open circuit voltage measurement, a consumed charge measurement, a resistance monitoring open circuit voltage measurement, a resistance monitoring battery voltage measurement and a resistance monitoring sense voltage measurement to a processor.

* * * * *